(12) United States Patent
Percin et al.

(10) Patent No.: US 7,444,615 B2
(45) Date of Patent: Oct. 28, 2008

(54) CALIBRATION ON WAFER SWEET SPOTS

(75) Inventors: Gokhan Percin, San Jose, CA (US);
Ram S. Ramanujam, San Jose, CA (US); Franz X. Zach, Los Gatos, CA (US); Abdurrahman Sezginer, Los Gatos, CA (US); Chi-Song Horng, Palo Alto, CA (US); Roy Prasad, Los Gatos, CA (US)

(73) Assignee: Invarium, Inc., San Jose, CA (US)

( * ) Notice: Subject to any disclaimer, the term of this patent is extended or adjusted under 35 U.S.C. 154(b) by 426 days.

(21) Appl. No.: 11/139,551

(22) Filed: May 31, 2005

(65) Prior Publication Data
US 2006/0266243 A1 Nov. 30, 2006

(51) Int. Cl.
*G06F 17/50* (2006.01)
(52) U.S. Cl. .............................. 716/19; 716/1; 716/20; 716/21; 703/14

(58) Field of Classification Search .................. 716/1, 716/19, 20, 21
See application file for complete search history.

(56) References Cited

U.S. PATENT DOCUMENTS 7,269,804 B2 * 9/2007 Tabery et al. .................. 716/4

\* cited by examiner

*Primary Examiner*—Thuan Do
(74) *Attorney, Agent, or Firm*—Sheppard Mullin Richter & Hampton LLP

(57) ABSTRACT

A method for generating an OPC model is provided which takes into consideration across-wafer variations which occur during the process of manufacturing semiconductor chips. More particularly, a method for generating an OPC model is provided which takes into consideration across-wafer variations which occur during the process of manufacturing semiconductor chips based on the parameters of test patterns measured at the "wafer sweet spots" so as to arrive at an accurate model.

25 Claims, 12 Drawing Sheets a      b      c

CALIBRATION ON WAFER SWEET SPOTS

CROSS REFERENCE TO RELATED APPLICATIONS

The subject matter disclosed in the present application might be considered to be relevant to subject matter disclosed in co-pending patent application Ser. No. 10/861,170 filed Jun. 4, 2004, co-pending patent application Ser. No. 10/933,090 filed Sep. 1, 2004, Ser. No. 10/960,357 filed Oct. 6, 2004 and Ser. No. 10/971,350 filed Oct. 22, 2004, all of which are assigned to the Assignee of the present application and the entire disclosure of each of which is hereby incorporated by reference herein for all purposes.

FIELD OF THE INVENTION

The present invention relates to the field of fabrication of semiconductor devices and more particularly to improvements in the calibration of computational models of lithography applied during the process of fabricating a semiconductor chip.

BRIEF DESCRIPTION OF THE ACCOMPANYING DRAWINGS

In order that the invention may be readily understood and put into practical effect, reference will now be made to exemplary embodiments as illustrated with reference to the accompanying drawings, where like reference numerals refer to identical or functionally similar elements throughout the separate views. The figures together with a detailed description below, are incorporated in and form part of the specification, and serve to further illustrate the embodiments and explain various principles and advantages, in accordance with the present invention where:

FIG. 6d shows the mask-induced variability in the measurement in FIG. 6a.

FIG. 7d shows the mask-induced variability in the measurement in FIG. 7a.

Figure 1:
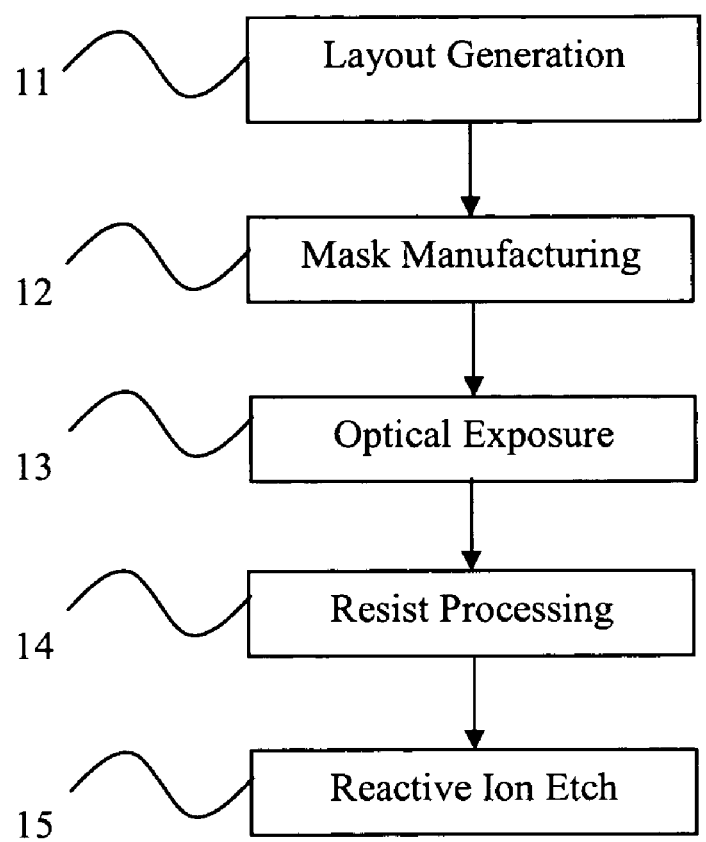
FIG. 1 illustrates the schematic representation of a semiconductor manufacturing process.

Skilled artisans will appreciate that elements in the drawings are illustrated for simplicity and have not necessarily been drawn to scale. For example, the dimensions of some of the elements in the drawings may be exaggerated relative to other elements to help to improve understanding of embodiments of the present invention.

DESCRIPTION OF THE RELATED ART

Semiconductor device manufacturing comprises many steps of patterning layers. A layer is either the substrate of the semiconductor wafer of a film deposited on the wafer. At some steps, a pattern is etched into a layer. At some other steps, ions are implanted in a pattern into the layer. Patterning process comprises: lithography and etch or implant. The prevalent form of lithography is optical projection lithography, which involves making a mask or reticle that embodies the pattern to be projected onto the wafer; projecting an image of the mask onto a photoresist film coated on the wafer; exposing the photoresist; and developing the latent image, thereby making a stencil on the wafer. Other forms of lithography include mask-less optical projection lithography where the mask is replaced by a spatial light modulator, which is driven by data representing the pattern; direct electron-beam writing lithography; and imprint lithography.

Thus, as described above, optical projection lithographic patterning process adopted for manufacturing semiconductor devices involves a series of steps. In the following paragraphs, a detailed overview of the patterning process is provided and the same is schematically depicted in FIG. 1.

Detailed Overview of the Patterning Process

Now referring to FIG. 1 of the accompanying drawing, the process of patterning comprise layout generation 11, mask manufacturing 12, optical exposure 13, resist processing 14, and reactive ion etch 15. From a patterning perspective, the flow-diagram represents the sequence of transformations and distortion that the initial layout undergoes until it finally appears as an etched pattern in a silicon microchip. Therefore, one may envisage each one of the steps in this figure as a series of "black boxes." Each box receives an image as its input and converts it to an output image. The image conversion inside the box is representative of the kind of image transformations and distortions that characterize the process. The ultimate goal of the combined process is to obtain a wafer pattern that is as close as possible to the initial layout. Each of these boxes will now be described in detail.

Layout Generation 11

The starting point of the process is layout generation 11. A layout describes, in graphical form, the desired pattern in the final microcircuit. The layout is most commonly an arrangement of shapes such as polygons, rectangles, and sometimes other features such as circles. These patterns are created in layout editors, such as Virtuoso®, commercially available from CADENCE®. Layout editors are software programs that allow the creation, display, and manipulation of a large number of shapes representing the final layout of the microcircuit. The microelectronic chip is created through multiple patterning steps. Each one of these layers is created using its own exposure, mask, and etch processes. Therefore, the complete manufacturing of the microcircuit involves a series of repetitions of the process described in FIG. 1, each one for a single layer layout. In most cases, the description of the shapes, their sizes, locations, and other relevant information is stored in a file that can be held on any convenient storage medium such as disk, hard disk, CD, etc. and such file is usually called a layout file. Thus, the layout file contains the description of the shapes, their sizes, location and other relevant information for a multiplicity of layers. For the sake of simplicity, we assume that only one such layer is present in the layout.

Mask Manufacturing 12

The output of the layout generation block 11, i.e. the layout file, is then transferred to the mask write tool. Masks are plates most commonly made from fused silica, covered with chrome or, in some cases, other suitable materials. The output of the mask manufacturing block 12 in FIG. 1 is a plate with a pattern etched into chrome. Converting the input layout file into an etched pattern on a fused silica plate is achieved in a series of manufacturing steps that involve exposing a resist covering the chrome-coated plate with an e-beam (in some cases, this may be a laser light source), heating the resist to a predefined temperature and for a predefined amount of time, developing the pattern on the mask, removing the chrome from the plate in the areas that are not covered by resist (most commonly through reactive ion etching), and, finally, removing the resist from the plate. The spatial pattern distribution of the e-beam exposure is determined through yet another series of software algorithms from the received input file. In this step, distortions between the pattern as received by the mask manufacturer and the final pattern etched into the chrome layer on the mask occur through a variety of mechanisms. For one, the exposure of the resist to an e-beam creates more than the primary, intended exposure dose. Electrons that have penetrated the resist will be heavily scattered in the underlying chrome and fused silica layers with a significant fraction of those scattered electrons returning into the resist layer. The electrons scatter over considerable distances (several micrometers), exposing the resist to a "blurred" background of electrons. This background contributes to variations in linewidth of the mask features depending on the overall pattern density in the surrounding area.

Optical Exposure 13

Figure 2:
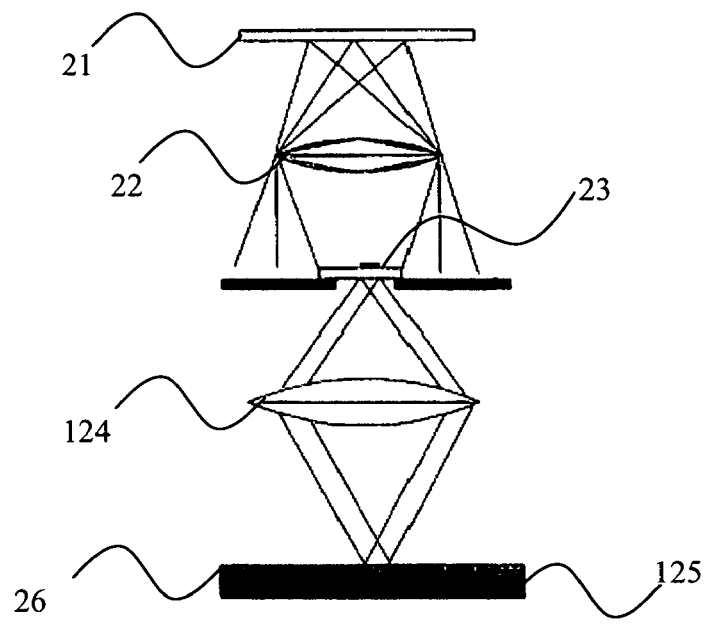
FIG. 2 is a schematic representation of a lithographic exposure tool of a preferred embodiment.

The mask is the primary "template" used to generate the wafer patterns. Through optical exposure tools, the pattern is transferred from the mask onto a wafer. FIG. 2 is a schematic representation of a lithographic exposure tool. For the sake of simplicity, of the many components and subunits of an exposure tool, only the following are shown: an extended light source 21, illuminator optics 22, a mask with a chrome pattern 23, projection optics 24, and a wafer 25 coated with resist 26. The illuminator optics 22 comprise a set of optical elements suitable to uniformly distribute light from the light source 21 onto the exposure mask 23, which is also known as a reticle. The illuminator optics 22 on state-of-the-art exposure tools not only delivers highly-uniform light intensities across the mask 23, they also provides precise control over the angular characteristics of the light impinging on the reticle 23. For example, the angle of incidence can be restricted to within a defined range from a minimum angle of incidence to a maximum angle of incidence. The value for both settings is typically user controllable. This particular illumination pattern is referred to as annular illumination. The limiting case where the largest angle of incidence is 90 degrees is referred to as conventional illumination. More sophisticated illumination patterns not only limit the range of angles of incidence, they also restrict the angle within the plane. Quadrupole- or dipole-illumination are illumination modes that fall in this category. The type of illumination (conventional, annular, quadrupole, dipole, etc.), as well as the parameters of the particular mode chosen, may be selected by the user.

Light that passes through the mask 23 enters the projection optics 24, which then form an image of the mask pattern on the resist coating 26. The best image, described by the highest fidelity between the mask pattern and the pattern imaged on the wafer 25, is achieved only for a specific distance between the wafer 25 and the projection lens 24 and, to a lesser degree, for a limited range around the so-called best-focus condition. Any movement of the wafer 25 away from this position, either closer or away from the projection lens 24, is referred to as defocus. Overall, the output of the optical exposure block 13 is a spatial distribution of light patterns created through the projection optics.

Resist Processing 14

The manufacturing of microelectronic chips is performed using flat disk-shaped pieces of silicon called wafers. For lithographic processes, the wafer is typically coated with at least one, sometimes more, thin polymer layers. Coatings are formed by dispensing a small amount of the polymer dissolved in the appropriate solvent onto the wafer and then rapidly spinning the wafer. The spin process uniformly distributes the polymer (also called as resist) over the wafer. In addition, aided by the rapid movement of the wafer, the solvent evaporates, increasing its viscosity up to the point where the resist is no longer fluid but forms an essentially solid film on the wafer. Even though this process delivers layers of fairly high uniformity, some small variations in the thickness of the polymer layer remain.

At least one of the polymer layers, called the resist layer, is sensitive to light exposure. Upon exposure of the resist to radiation, chemical reactions are initiated that ultimately change the resist solubility in certain aqueous solutions. While the exposure only initiates the initial steps, the chemical reactions require thermal energy to complete. Therefore, the wafer is placed on a bake-plate at an elevated temperature, a step commonly referred to as post-exposure bake. As mentioned above, the chemical reactions resulting in a modified solubility are temperature-dependent, and, therefore, non-uniformities of the temperature distribution across the bake plate lead to small variations in the solubility of the exposed areas.

After the bake process, the wafers are cooled down to room temperature and then covered with an appropriate solution that removes resist from regions with high resist solubility, whereas the resist remains on the wafer in the areas of low solubility. This process is commonly referred to as the development process. The solubility change depends in a highly nonlinear, approximately step-like fashion on the radiation dose. This is a property of great significance, as it avoids the effect that there is a gradual transition in resist thickness between areas where the resist has been completely resolved to areas where the resist solubility is very low. Rather, the most desirable result is a "digital" pattern consisting of areas free of resist and areas where the resist has not been dissolved at all.

There are two categories of dose dependencies. For example, there are resists that have very low to negligible development rates at low doses, and their development rate increases with increasing dose. Such resists are referred to as positive resists. The inverse relationship—high development rate at low doses and small development rate at large doses—is found in negative resists.

The amount of time that the solution remains on the wafer, the temperature of the developer, and, more importantly, the temperature of the wafer, impact the speed with which the resist is dissolved. Therefore, non-uniformities in any one of these parameters across the wafer will impact the exact shape of the patterns formed in the resist. Similarly, bake plate variations impact the solubility of resist and, therefore, again result in variations of the precise shape of the features.

As a result of this process, a pattern in resist can be created, provided the resist can be exposed to a corresponding distribution of bright and dark areas. The sequence of steps between the exposure of the resist to the light created from projecting the mask and the resist pattern revealed after development of the wafer is included in the box labeled "resist processing" 40 in FIG. 1. Distortions in the image occur through a variety of mechanisms that involve, for example, a description of the diffusion processes that occur during the post-exposure bake, as well as modifications that occur during the development process.

Reactive Ion Etch 15

Finally, the pattern, as it is formed in resist, is transferred into the underlying films on the wafer through a process called reactive ion etch (RIE) 15. In this process, the underlying films are removed from the areas that are not covered by resist, mostly through the erosion and chemical reactions induced by the ions. While this process is highly anisotropic in that the erosion progresses preferentially in a vertical direction, there are still a variety of mechanisms that lead to deviations between the appearance of the final pattern relative to that of the resist pattern. Most notably, the erosion process is not entirely anisotropic in that there is a lateral component of the etch process that tends to shrink the width of those features covered by resist. In addition, there is the reverse process, whereby the areas in the final image that were covered with resist grow relative to the size of the resist pattern through a passivation process. This passivation occurs when byproducts of the etch process deposit on the sidewalls of the features to be etched. Through continuous deposition of such passivation layers during the etch process, the width of the non-etched features increases as the process proceeds.

Since the invention of ICs, efforts are being continuously made to increase the number of transistors incorporated per device. In fact, the number of the transistors incorporated per device has grown exponentially. This is consequential to significant reduction in the size of the chip features. It should be noticed that the decrease in the size of the chip features can be attributed to the use of light source having very short wavelength for the purpose of lithography accompanied by the improvement in the overlay tolerances in photolithography. It can be said that the above factors have enabled significant reduction in the resolution limit and thereby achieving decrease in feature size below 1 micron. Due to the above factors, fabrication of ICs with transistors at feature size below 0.18 micron has become a routine now.

It should be noticed that the currently adopted process of etching which results in feature size below 0.18 micron, called 'sub-waveform lithography' is based on the principle of etching features that are smaller than the lithographic wavelength. As it is commonly known in the art, maintaining resolution of anything smaller than a wavelength is quite difficult since, pattern fidelity decreases dramatically in sub-wavelength lithography. Due to pattern fidelity deterioration, the resulting semiconductor feature may deviate significantly in size and shape from the pattern drawn by the circuit designer.

The deviations from the original pattern drawn by the circuit designers (hereafter being called as pattern distortion) affect the performance of high-speed semiconductor devices. For example, line width variations at the gate level affect gate length, hence, speed and leakage current of CMOS transistors. Line width variations in the metal interconnection layers affect self and cross-capacitance and inductance of the interconnections. Unintentional variations in the line width limit the clock speed at which the device will function. Therefore, line width uniformity maps to higher revenue.

Line width can vary from wafer to wafer, across the wafer, across the lithography imaging field, and across the chip (die). Variations have systematic (reproducible) and random components. Minimizing the wafer-to-wafer and across the wafer variations is the object of automatic process control and automatic equipment control (APC/AEC), whereas reducing across-chip and across-field variations is best achieved by compensating the mask layout for across-field variations in the patterning process.

The following processes contribute to pattern distortions. Some of these effects depend on the field position:

Mask writer position error: optical and electron-beam mask writers scan an image either in raster or vector mode. In either embodiment, electronic noise and nonlinearity in the driver circuit of the scanning system lead to random and systematic beam position errors, respectively. Mask writers move the wafer in the x and y positions, writing one swath at a time. Errors in wafer position cause stitching errors between swaths or fields.

Spreading of the mask writer beam: Optical mask writers are subject to diffraction. Electron beams diverge due to the Coulomb force. Both effects spread the beam. This distortion does not depend on the position in the field, but ignoring it in mask design can cause across-chip variability.

E-beam proximity effect: In an e-beam mask writer, electrons scatter in the resist and in the mask. Scattered electrons laterally smear the exposure. The length scale of this effect is on the order of 10 μm on the mask. A software proximity correction modulates the exposure dose to compensate for the proximity effect. However, the correction is not perfect.

Fogging and flare in the mask writer: In an e-beam mask writer, secondary and backscattered electrons from the wafer scatter off parts of the e-beam column and chamber and expose the wafer. The length scale of fogging is on the order of 10 mm. Laser mask writers are subject to flare, which can be caused by multiple reflections between the interfaces of lenses and scattering from microscopic roughness of the surfaces of optical components.

Mask Etch: Etching of the chrome film on the mask depends on the average pattern density in a long-range (on the order of 1 mm). Variations in mean pattern density cause variations in the widths of features etched into chrome. Non-uniformity of silica etch-depth in phase shift masks cause phase errors.

Illumination of the lithography projector: The pupil illumination of the lithography projector has a prescribed shape such as a circle, annulus, or dipole. Either the intensity within the prescribed shape is assumed uniform, or the actual distribution is measured. If the illumination distribution differs from the one assumed during the chip design, the printed pattern will be distorted. If the pupil illumination pattern or total intensity varies across the slit of the lithography projector, this variation causes a pattern distortion that depends on the field position.

Multiple scattering at the mask: Scattering or diffraction of electromagnetic waves from a strong scatterer, such as the mask, is highly nonlinear due to multiple scattering. This effect is not position dependent but ignoring it in mask design can cause across-chip variability.

Imaging with finite aperture optics: Features of the aerial image are subject to the wave and electromagnetic field nature of light. The imaging system is a low-pass filter in the spatial frequency domain. This limits how fast light intensity can change as a function of position on the wafer. This is by far the most significant contributor to image distortion in the sub-wavelength domain. This distortion is not position dependent, but ignoring it in mask design causes strong across-chip variability.

Projection lens aberrations: Projections lenses have wavefront errors that are on the order of $1/100$ of a wave. The wavefront error depends on the position in the pupil plane and on the position in the image field, a total of 4 scalar variables. Lens aberrations distort the image in a pattern and position dependent manner.

Flare in the projection lens: Any mechanism that sends a portion of a light ray in an unintended direction increases the background light level and reduces the contrast. Such mechanisms include: volume-scattering in lenses due to density variations in the lens material; surface scattering off grinding marks and other surface roughness on lens and mirror surfaces; multiple reflections between lens elements, wafer, mask, or the lens barrel. Flare depends on the position in the imaging field.

Lithography scanner position error: Lithography stepper-scanners use a slit-shaped subset of the image field to keep the lens aberrations low. The size of the slit is on the order of 26 mm by 8 mm on the wafer. The wafer and the mask are scanned in synchronization along the short dimension of the slit on the order of 33 mm at speeds up to 500 mm/s. The mask and the wafer are scanned in opposite directions and the ratio of their displacements must equal the lens magnification precisely. Relative position errors between the wafer and the image of the mask on the wafer can have random and systematic components. Random position errors blur the image.

Diffusion of reactants in the resist: After the resist is exposed, its temperature is elevated. This process is called post-exposure bake. Elevated temperature increases the diffusion coefficient of the reactants in the resist. Diffusion diminishes the contrast of the high-spatial frequency components of the image. The diffusion length, which is on the order of 30 nm, can vary across the wafer. This distortion does not depend on the position in the field, but ignoring it in mask design causes across-chip variability.

Wafer-etch: The difference in a critical dimension in the developed resist pattern and in the etched pattern is called etch-bias. Etch bias depends on the density of the pattern over a long range. This can cause an across-chip variation in the etch bias.

Thus, to overcome the effects of these distortions, usually corrective measure are taken at the time of preparing the photomask themselves. The corrective measures are generally referred to as "Optical Proximity Correction" (OPC). In OPC, the design pattern is pre-distorted to compensate for systematic distortion that are usually introduced during fabrication.

The OPC is carried out by software program that reads in the information regarding the shapes present in the layout and modifies the shapes through well-defined software algorithms. These algorithms incorporate a mathematical representation of the image distortions that occur in the subsequent process steps. The ultimate goal of OPC is to modify the shapes in a fashion that compensates, as best as possible, the distortions introduced during the subsequent steps to provide a final image (i.e., the output of the last block 15 in FIG. 1) that resembles, as closely as possible, the pattern described in the initial layout. In general, the mathematical representation of the process incorporates a set of adjustable parameters. Therefore, it is quite common to have a "calibration" procedure. Essentially, this involves adjusting the parameters in an iterative loop that compares simulated and measured data until satisfactory agreement between both sets of data has been obtained. This process will be described in more detail below.

OPC involves modification to the design pattern to compensate for change in feature shape and size that occur during pattern transfer from a reticle to a wafer. Distortions that are corrected by OPC include line-end shortening and corner rounding, among others.

Line-end shortening (LES) is the shortening of the end of a metal line end in the actual fabricated semiconductor device as compared to the circuit designer's originally contemplated ideal device. OPC can be used to correct LES by adding serifs or hammerheads to the originally designed end in the photomask, such that during photolithography, the actually fabricated end more closely approximates the location of the originally designed end.

Corner rounding is the degree to which the lithography process rounds feature corners that should be at sharp angles. OPC can be used to correct corner rounding by adding serifs to outside corners, which are called positive serifs, and subtracting serifs from the inside corners, which are called negative serifs, to the feature in the photomask.

Currently two methods are being followed for calculating the required corrections i.e. the Rule-based and the Model-based approaches. The Rule-based Optical Proximity Correction uses a look-up table to determine a correction bias for the pattern. Spacing between features and features sizes and shapes are measured, which correspond to a particular degree of correction in the look-up table. A rule-based approach is simpler to implement and the changes to the pattern are easier to control. However, certain situations may not be represented in the rule and improper correction may be made.

Model-based approach uses an iterative distortion of the design pattern. A model predicts the effects of the distortions occurring during wafer patterning, and modifies the design pattern to correct for these distortions. The pattern that would result from the modified design pattern is then modeled and compared to the desired pattern. This process typically undergoes several iterations until, the modified pattern produces a result that matches the input pattern. A model based approach can usually cover all situations, but is generally slower to correct because of the required iterative process.

The Model-based approach utilizes a mathematical model that contains a number of adjustable parameters. For example, in the case of the optical model, adjustable parameters may be the precise shape and angular distributions of light delivered by the illuminator to the reticle. Other adjustable parameters may describe the deviations of the projection optics and its imaging performance from the ideal setting. Some of these parameters are referred to as aberrations. However, it is worthwhile mentioning that aberrations are only a subset of a larger set of parameters describing non-ideal lens performance. The extended set of parameters describe not only the phase deviation, but also the lens absorption as a function of diffraction angle as disclosed, for example, in P. Dirksen et al, Proc. SPIE Vol. 4691 (2002), p. 1392. Non-ideal imaging may be a result of imperfections during the lens manufacturing, less than perfect mounting and orientations of the individual lens elements, or material degradations, to name a few.

In another example, for the case of resist modeling, a variety of approaches are used. Some of them are purely empirical modeling based on the so-called variable-threshold model, as described, for example, in N. Cobb et al., Proceedings of the SPIE, vol. 2726 (1996), p. 208. Others models use parameters more anchored in the mechanisms that occur in the resist, for example, diffusion length and contrast of the resist, an example of which is described in T. A. Brunner, SPIE Vol. 2726 (1996), p. 198. These parameters are not a priori known for the process but need to be determined experimentally, a process called "model calibration." The term may sometimes be used more specifically. For example, "resist calibration" would refer to the experiments needed to determine parameters used in the resist model.

Figure 3:
FIG. 3 illustrates a test pattern that can be used to locate a sweet spot on a wafer.

Most commonly, the calibration process involves designing a set of test features (also referred to herein as test structures or patterns), placing them on a reticle, exposing the reticle, and processing the wafers through the complete set of processes described in FIG. 3 and then measuring a characteristic of the patterns. The type of patterns selected, the type of exposure conditions used, and the type of characteristics measured on these features essentially control which one of the parameters for each of the modules shown are being determined. For example, a series of line and space patterns where line-widths and space-widths are modified in a specific manner may be used to calibrate the resist model. In many cases, the process involves exposing the test-patterns at a multitude of exposure conditions. For example, in the case of an aberration measurement, a multitude of focus values may be necessary to determine aberrations. Primary interest for applying modified exposure conditions arises from experiments, whereby the characteristics of the exposure tool or the resist process are determined. For example, the characterization of the light distribution in the illuminator requires a set of experiments to be performed at a variety of dose conditions, as outlined in J.P. Kirk et al., "Pupil Illumination; in situ measurement of partial coherence," Proc. SPIE, Vol. 3334, (1998), p. 281-288. In another application, J. Schacht et al., "Calibration of OPC models for multiple focus conditions," Proc. SPIE. Vol. 5377 (2004), p. 691-702, discloses a methodology whereby a variety of focus conditions is used during the calibration of an OPC model. Additional details regarding the usage of various exposure conditions for the calibration of resist models are given in U.S. patent application Ser. No. 10/861,170, filed Jun. 4, 2004, which is assigned to the assignee of the present application and is hereby incorporated by reference.

The calibration process, per se, involves comparing the experimental results with simulated data, evaluating the differences between the two, and then modifying one or several of the model parameters. This process, in most cases, is repeated multiple times until good agreement is achieved between model and experimental data. Even if one does not require several exposure conditions to determine the parameters required in the OPC model, having multiple measurements for a single feature is advantageous in that the measurement noise introduced by the metrology tool may be reduced significantly, resulting in drastic improvements in the quality of the models created.

Thus, one can say that an essential element of model-based OPC is a computational model of the patterning process. The computational model describes all or some aspects of: optical projection, reactions and diffusions of chemicals in the photoresist, and etching of the wafer. The computational model usually has parameters that need to be determined empirically. These parameters are determined by printing test patterns on wafers using the lithography equipment and process that need to be modeled. Critical dimensions of the patters resulting on the test wafer are measured. Some parameters of the model and the patterns printed on the wafer are minimized. The process is "calibration" of the model.

Some of the models describing lithography process and exposure toll is based on measurements taken usually at the center of the wafer. Bula et al., U.S. Pat. No. 6,704,695 granted on Mar. 9, 2004 describes an interactive optical proximity correction design method. The method includes creating simulated printed data, merging, applying tests and correcting, which are repeated.

Yu, U.S. Pat. No. 6,749,972 granted on Jun. 15, 2004 describes yet another OPC technique in which common process window over varying feature pitch is maximized.

It can be clearly noticed that none of these prior art documents take across wafer variations into consideration while developing the model-based optical proximity correction.

As would be known to a person skilled in the art, across-wafer variations are caused by:
1. Spatial variations in the ramping history and steady-state value of the temperature in the post-exposure and pre-exposure bake process.
2. Spatial variations in the refractive index, extinction coefficient, and thickness of photoresist, anti-reflective coatings (ARC), underlying film stack and underlying pattern.
3. Spatial variations in the concentration, temperature and acceleration energy of materials in the etch chamber, if the calibration is performed on etched wafer.

Spatial variations in the ramping history (cause-1) affect the diffusion lengths of reactants in the photoresist, which in turn affects the image resolution of the resist (also called resist blur). Spatial variations in the refractive index and spatial variations in the concentration (causes 2 and 3) affect the threshold, that is, the minimum area-density of incident light energy that is needed to dissolve a positive photoresist, or not to dissolve a negative photoresist, upon development.

Thus, there exists a need to provide an improved method for calibration of model based OPC which overcomes the disadvantages existing in the above-mentioned prior art documents.

Objects of the Present Invention:

The main object of the present invention is to provide a method for generating an improved OPC model for correcting errors in the image of an integrated circuit formed on a resist layer of a semiconductor.

In another object of the present invention is to provide a method for generating an OPC model which takes into consideration across-wafer variations which occur during the process of manufacturing semiconductor chips.

In yet another object of the present invention is to provide a method for utilizing an across-wafer variation obtained to determine a best location on the wafer for generating an OPC model.

In still another object of the present invention is to provide a method for determining "wafer sweet spots" on the wafer where the across-wafer variation is minimum.

A further more object of the present invention is to calibrate an OPC model which takes into consideration across-wafer variations which occur during the process of manufacturing semiconductor chips based on the parameters of test patterns measured at the "wafer sweet spots" so as to arrive at an accurate model.

SUMMARY OF THE INVENTION

In accordance with one aspect of the present invention, there is provided a method for generating an OPC model which takes into consideration across-wafer variations which occur during the process of manufacturing semiconductor chips. More particularly, in accordance with a preferred embodiment of the present invention, provides a method for generating an OPC model which takes into consideration across-wafer variations which occur during the process of manufacturing semiconductor chips based on the parameters of test patterns measured at the "wafer sweet spots" so as to arrive at an accurate model.

The following paragraphs are provided in order to describe the best mode of working the invention and nothing in this section should be taken as a limitation of the claims.

DETAILED DESCRIPTION OF THE PREFERRED EMBODIMENTS

Before describing in detail embodiments that are in accordance with the present invention, it should be observed that the embodiments reside primarily in combinations of method steps related to calibration of computational models of lithography applied during the process of fabricating a semiconductor chip. Accordingly, the method steps have been represented where appropriate by conventional symbols in the drawings, showing only those specific details that are pertinent to understanding the embodiments of the present invention so as not to obscure the disclosure with details that will be readily apparent to those of ordinary skill in the art having benefit of the description herein. The terms "comprises", "comprising", or any other variations thereof, are intended to cover a non-exclusive inclusion, such that a process, method that comprises a list of steps does not include only those steps but may include other steps not expressly listed or inherent to such process, method. An element proceeded by "comprises . . . a" does not, without more constraints, preclude the existence of additional identical steps in the process or method that comprises the steps.

As described in the preceding paragraphs, the calibration process, per se, involves comparing the experimental results with simulated data, evaluating the differences between the two, and then modifying one or several of the model parameters. This process, in most cases, is repeated multiple times until good agreement is achieved between model and experimental data. Even if one does not require several exposure conditions to determine the parameters required in the OPC model, having multiple measurements for a single feature is advantageous in that the measurement noise introduced by the metrology tool may be reduced significantly, resulting in drastic improvements in the quality of the models created.

When a variety exposure conditions are employed, it has been found that it is difficult to reliably obtain the experimental data. In the most common implementation of the experimental procedure, each exposure field, representing one of the exposure conditions, is placed adjacent to the other exposure field. The transfer of the complete mask image onto the wafer is most commonly achieved by exposing a slit-shaped region of the mask at a time. Image transfer of the full mask image is accomplished through simultaneous, highly-coordinated movement of both reticle and wafer stage, a process referred to as scanning. The maximum area of the wafer that can be exposed in a single exposure is referred to herein as the exposure field. The exposure field corresponds to the area of the wafer that would be exposed in the event that the mask is completely clear, and its size and shape are, therefore, governed by the exposure tool. In general, the exposure field is of rectangular shape, and the most common mode of exposing multiple fields on the wafer is to place them adjacent to each other in a gridlike fashion on the wafer. In normal operation, each field on the wafer is only exposed once and with fixed exposure conditions. Therefore, one would expect that a particular feature, when measured in any one of the exposure fields, gives identical measurement values (within the error of the measurement methodology itself). Unfortunately, in reality, one finds significant variations depending on the location within the wafer where the feature has been placed. A variety of mechanisms contribute to this effect. For example, the temperature distribution on the bake-plates for the post-exposure bake (PEB) process may not be uniform. Non-uniform bake plate temperatures lead to variations in the size of the resist features that occur after develop. Other variations may be introduced by non-uniform temperature distributions at the resist-developer interface as a result of a difference in the temperature of the developer and the wafer. Such variations are superimposed on intended variations and, therefore, lead to errors in the calibration of the OPC models.

As noted above, Van der Laan et al. (U.S. Pat. No. 6,646,729) describes a methodology for aberration measurements, whereby the issue of across-wafer variation is circumvented via "micro-stepped" or "die-in-die" exposures. Similarly, Nomura et al. (U.S. Pat. No. 6,130,747) describes a methodology referred to as micro-stepping whereby the exposures needed for an assessment of astigmatism (one of the aberrations) is performed by placing exposures of similar features in close proximity through multiple exposures that are placed in slightly different locations.

Besides across-wafer variation in the measurement data, there are also across-exposure field variations. Across-exposure field variations refer to effects, whereby the distortions of a pattern, induced through one of the processing steps depend on the location of the pattern within the field. Sources of such variations are, for the most part, caused by field-dependent variations in the mask and optical modules.

Contrary to the across-wafer variations, across-field effects can be corrected, as quite a few of these effects are systematic in nature. With respect to OPC modeling, this means that one of the parameters that is preferably included for the OPC model calibration is the location of the test structure within the exposure field. As a full assessment of the across-field dependencies preferably takes into account the pattern distributed over the entire exposure fields and, therefore, large exposure fields, the impact of across-wafer variations on OPC model calibrations is further aggravated.

Improved Methodology for OPC Model Calibration

In view of the complications and difficulties involved in obtaining a reliable set of experimental data impacted to the minimum extent possible by across-wafer variations, an improved methodology for OPC model calibration is disclosed. In particular, emphasis is made on the ability of obtaining such data in a field-position dependent manner. The various steps of this improved methodology will now be described.

Providing a Model

The first step in this process is to provide a numerical or mathematical model that represents the pattern modifications that occur during at least one of the patterning processes involved and contains a set of adjustable parameters. Besides simply providing a listing of the process steps, the model also corresponds to a series of image transformations describing the modifications or distortions of the patterning process. These image transformations are referred to as a model. Models will contain a set of adjustable parameters.

Optical models are fairly well developed in the literature, and the basic theories are detailed in a variety of textbooks, e.g., Born and Wolf, Principles of Optics, Cambridge University Press, $7^{th}$ edition, 1999. Adaptations of the generic theory to the particular requirements of the lithographic process are described in: N. Cobb, Ph.D. Thesis, University of California, Berkeley and A. Rosenbluth et al., Proceedings of the SPIE Vol. 5377 (2004), p. 615.

Creating Test Patterns with a Layout Tool

Next, a set of one or more test patterns/features is created using a layout editor. As used herein, the term "set" refers to a group of one or more than one member. Test-patterns comprise a variety of shapes; most commonly, line and space patterns with a variety of combinations in line width and space width (as shown in FIG. 3), line end foreshortening structures, contact patterns, or other suitable features. The ease with which a particular model parameter can be extracted from printed wafer results depends heavily on the choice of test patterns.

If a sufficiently large area is available, multiple sets of test patterns may be placed in the layout. The individual sets may be of different nature (i.e., there may be patterns for determining the parameters of an optical model, as well as patterns for the evaluation of the resist model placed on the same reticle). In another embodiment, multiple instances of the same test pattern may be placed across the reticle field. In this case, the patterns are used to determine the across-field dependencies of the model parameters. While, in general, the parameters of the resist model are, for the most part, field-position independent, others, such as the optical model or the parameters of the mask model, may exhibit pronounced across-field dependencies.

Surrounding the Test Patterns with a Chrome Frame

The next step in accordance with this preferred embodiment is to surround the test patterns with a chrome frame. While some patterns are, by nature, surrounded by chrome (for example, contact patterns), others, such as line space patterns, may not necessarily be surrounded by chrome. The purpose of the chrome frame is to protect an area surrounding the test pattern from exposure to light. Thus, in a subsequent exposure, this frame may be used to place additional patterns in the same exposure field. In the same fashion, the chrome frame also prevents light from reaching areas that have been exposed during a previous micro-stepped exposure, thus preserving the characteristics of that exposure. As noted above, materials other than chrome may be used to serve the "blocking" function described herein. Accordingly, the use of chrome should not be read into the following claims unless explicitly recited therein.

Performing the Exposures in a Micro-Stepped Fashion

Figure 4:
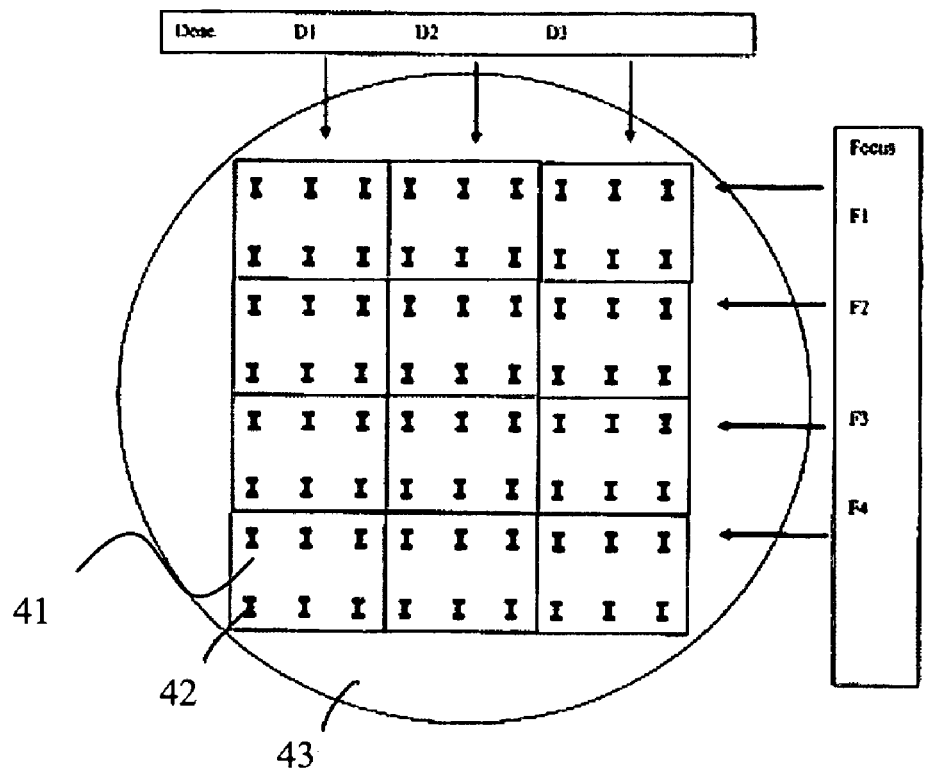
FIG. 4 is an illustration of an exposure approach.

As shown in FIG. 4, a multitude of dark features (41) are placed on a bright background within the mask. According to this approach, the wafer (42) is exposed in a regular, grid-like pattern, where the individual exposure fields (43) are placed adjacent to each other and, typically, without any or little overlap.

Each individual field (43) is exposed with one particular set of exposure conditions. As a result of the large field sizes necessary for an evaluation of across-field variations, the multitude of fields placed on the wafer (42) cover a large fraction of the wafer (42). In the most-common exposure mode used for the manufacturing of micro-electronic chips, each individual field (43) is exposed with a single exposure condition characterized, for example, by the defocus distance, exposure dose, and illuminator setting, among others. In a less common exposure mode, which, however, is useful for the characterization of lithographic processes or scanner characteristics, the exposure fields (42) are not exposed with fixed conditions. Rather, a multitude of conditions is applied, one for each exposure field (42). For each field (42), one of the exposure conditions may be changed, for example, doses, focus, or illumination conditions. In the example shown in FIG. 4, dose values for each exposure field are changed in the horizontal axis, and focus values have been changed in the vertical axis.

In this preferred embodiment, rather than using non-overlapping exposures, the individual exposure fields corresponding to, for example, different conditions of dose and focus or other exposure conditions (or the same exposure conditions), are micro-stepped. That is, the wafer and/or mask is shifted by an amount smaller than the width of the chrome frame, such that the exposure field of one exposure partially overlaps an exposure field of another exposure.

Figure 5:
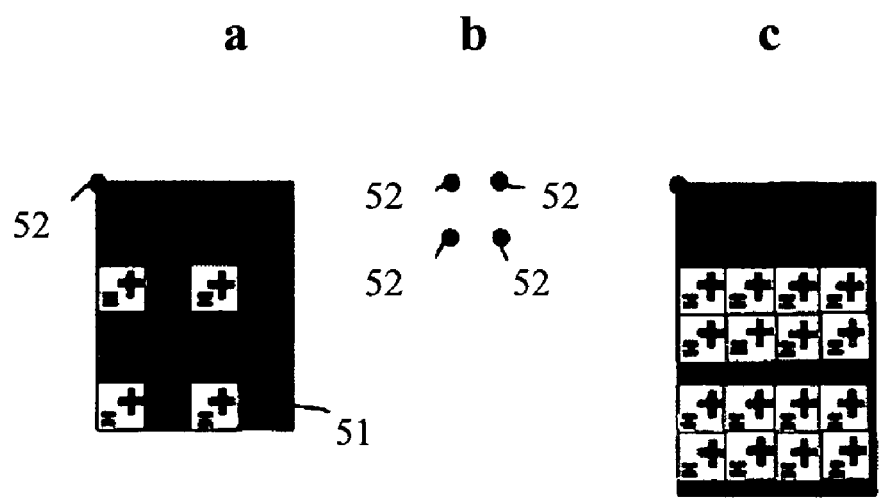
FIGS. 5a, 5b and 5c illustrate a mask, step pattern, and resulting wafer pattern of a preferred embodiment using micro-stepping.

FIGS. 5a-5c show the micro-stepped patterns according to this preferred embodiment. FIG. 5a shows that the mask 51 has test patterns surrounded by a chrome frame, and the circles 52 in FIG. 5b show that the mask 51 is stepped with a step-size smaller than the field size. In fact, the step size is preferably compatible with the width of the chrome frame, as the superposition of the dark I-bar onto an area that has been exposed to light in one of the micro-stepped exposures may not result in a discernable pattern. In this example, there is sufficient chrome width to perform one micro-stepped exposure in each direction, resulting in a 2×2 matrix, as shown in FIG. 5c. As noted above, for each one of these exposures, a different exposure condition may be chosen for each individual exposure, or the same exposure conditions can be used for multiple or all of the individual exposures.

Extracting a Characteristic

After processing the layout through a series of patterning processes including mask build, optical exposure, resist processing, and (potentially) reactive ion etch, a characteristic of the pattern is extracted from the modified layout. Examples of characteristics include, but are not limited to, a width of a line, a diameter of a circle, an average radius, and overall shape.

A variety of characterization techniques used for assessing exposure tool or lithographic process characteristics measure the critical dimension of this feature over a range of exposure conditions.

The type of characterization performed, the patterns investigated, and the exposure conditions selected, as well as the type of measurements selected, determine for which module within the process characterization model the data are the most relevant. For example, in the case of pupil characterization, which contributes to the parameters of the optical module, fairly large-diameter chrome pads (approximate size of several ums) are selected, and the exposures are performed at fairly large defocus values. For calibrations of the resist model, the test patterns investigated may be a series of line and space patterns, structures for characterizing line end foreshortening, or potential contact-like patterns. A resist model calibration may require exposing these features at several values of dose and defocus.

Most commonly, microscopes capable of very high magnifications, such as SEM's, are used to characterize the patterns printed on the wafer, even though optical microscopes may be suitable in some applications where fairly large features (appr. 1 µm or larger) are investigated. In some applications, such as the determination of aberrations, imaging capabilities of the microscope are important, as the characteristics of interest are the shape of the features printed. In other instances, it is sufficient to have a single value characterizing the width, length, or diameter of a feature. If the characterization can purely be made based on one-dimensional features, other technologies for pattern characterization, such as scatterometry or electrical linewidth measurements, may be suitable. Most metrology tools require some pattern recognition capabilities that enable the tool to precisely determine the location of the measurement site. As some of the exposures included significant changes in either dose or focus, small features exhibit relatively large pattern changes, which may cause the pattern recognition algorithms to fail.

OPC Model Calibration

The last step according to this preferred embodiment is the calibration of the OPC model using the experimental data as obtained through the previous steps. The experimental data have been obtained through a series of processing steps represented in FIG. 1. For calibration purposes, the layout as placed on the mask is simulated by processing the layout through the simulation tool encompassing the modules from the flow in FIG. 1. Each one of these modules describes the pattern distortion through a mathematical algorithm that contains a few specific parameters. For simulation purposes, a starting value for each parameter is assumed, and a simulated pattern is created. Experimental data is compared to the simulated results, and then the parameters of the model modified. This process is repeated in an iterative fashion until satisfactory agreement has been achieved between the simulated data and the experimental data. In this way, an iterative algorithm is used, whereby the expected result of the wafer-printing process using the process model is compared to the experimental data obtained through the previous steps, and the adjustable parameters are modified until satisfactory agreement is achieved between the simulated layout and the experimental results. At this point, the model is considered calibrated.

It should be noted that the embodiments described above can be implemented in any suitable way using any software and/or hardware. For example, the embodiments described above can be implemented as computer-readable program code embodied in computer-readable media. Also, lithography data that is corrected based on a prediction using any of the computational models described herein can be used to manufacture a device, such as in integrated circuit.

Across-wafer variations in threshold and resist blur confound the determination of the parameters of lithographic models. Multiple, typically on the order of hundred, distinct test features are used to calibrate a model. These test features are necessarily distributed over a region of non-zero extent so that they do not overlap each other. Test features may be replicated many times over the exposure field (typically a 26 mm×33 mm region) in order to capture the across-field variations caused by imperfections in the lithographic equipment. Since calibration test features are spread over some distance, they are to some extent affected by across-wafer variations. Changing the photomask data because of across-wafer variations in the patterning process is counterproductive. Since the wafer is exposed by stepping and repeating the exposure of the same photomask, across-wafer variations cannot be corrected by mask design and OPC. Therefore, care must be exercised to separate across-wafer variations from across-field variations and pattern induced variations. Prior art methods of model calibration use data from a single field, usually located at the center of the wafer, or data averaged over a handful of fields. Such methods are liable to contaminating the calibration data with across-wafer variations.

In U.S. patent application Ser. No. 10/861,170 filed on Jun. 4, 2004 and which is also assigned to the Assignees of the present application a method of obtaining across-wafer variations is provided. Form the ease of understanding the following paragraphs describe one of the embodiments by which the across-wafer variation has been determined in the aforesaid U.S. patent application.

Preprocessing of the Measurements: Decomposition of Wafer, Field Mask-Induced and Random Components of Variation The purpose of repeating structures and measurements over many points across the stepper field is to characterize variation of the patterning process across the stepper-scanner field. Across-wafer and wafer-to-wafer variations are best corrected by improving the control of these processes: spin-on and soft-bake of photoresist, exposure dose variation across the wafer, spatial uniformity of post-exposure bake and wafer etch. Across-wafer and wafer-to-wafer variations are not suitable for correction via the mask pattern since the same mask is used in a step-and-repeat fashion at each field. In order to determine across-field variations, across-wafer variations must also be determined. This is because across-wafer variations contribute to the variation across each field. Therefore, the two causes of variability need to be separated (see J. P. Cain, *Characterization of Spatial Variation in Photolithography*, M.S. thesis, University of California, Berkeley, 2002; Jason P. Cain, Costas J. Spanos, "Electrical linewidth metrology for systematic CD variation characterization and causal analysis," in *Metrology, Inspection, and Process Control for Microlithography XVII*, Proceedings of SPIE vol. 5038, 2003). For example, the decomposition is performed as follows:

$$measurement_{WAFER,DI}(s, x_f, y_f, x_w, y_w) = \qquad (1)$$

$$CD_{0s} + \sum_{mn} \{A_{mn}(x_f, y_f) a_{mns}\} +$$

$$\sum_{mn} \{B_{mn}(x_w, y_w) b_{mns}\} + \sum_{m} \{C_m(x_w, y_w) c_{ms}\} +$$

$$MEEF_s \, measurement_{MASK}(s, x_f, y_f) + Res_{DI}(s, x_f, y_f, x_w, y_w)$$

The first term on the right-hand side of (1), $CD_{0s}$, is the value of the measurement in the absence of across-field, across-wafer, and random variability.

The second term on the right-hand side of (1) represents smooth variation across the imaging field. This variation, for example, can be caused by position dependence of lens aberrations or flare. The basis functions $A_{mn}(X_f, y_f)$ are:

$$A_{mn}(x_f, y_f) = x_f^m y_f^n, \text{ or}$$

$$A_{mn}(x_f, y_f) = P_m(2x_f/F_x) P_n(2y_f/F_y)$$

where $P_m$ is the Legendre polynomial of degree m, and $F_x$ and $F_y$ are the dimensions of the field. Many other basis functions are possible. The advantage of Legendre polynomials is that they provide a complete, orthogonal basis with unity weighting over the stepper-scanner field (see Abramowitz, M. and Stegun, I. A. (Eds.), Ch. 22, *Handbook of Mathematical*

*Functions with Formulas, Graphs, and Mathematical Tables*, 9th printing. New York: Dover, pp. 771-802, 1972).

The third term on the right-hand side of (1) represents a smooth variation across the wafer. This variation, for example, can be caused by radial variation of the resist thickness or post-exposure bake temperature. The basis functions $B_{mn}(x_w, y_w)$ are:

$$B_{mn}(x_w, y_w) = x_w^m y_w^n, \text{ or}$$

$$\text{Zernike polynomial } Z_n(2x_w/D_w, 2y_w/D_w)$$

where $D_w$ is the diameter of the wafer. Many other basis functions are possible. Zernike polynomials are particularly advantageous because they are complete and orthogonal on wafer with unity weighting (see Born, M. and Wolf, E., *Principles of Optics*, Ch. 9, 6th ed. New York: Pergamon Press, pp. 459-490, 1989).

The fourth term on the right-hand side of (1) indicates field-to-field exposure variations:

$$C_m(x_w, y_w) = 1 \text{ if } (x_w, y_w) \text{ is in field } m$$
$$= 0 \text{ otherwise.}$$

The fifth term on the right-hand side of (1) is the mask induced variability. $MEEF_s$, mask error enhancement factor, is a scalar constant specific to structure s.

The sixth term on the right-hand side of (1), $Res_{DI}(s, x_f, y_f, x_w, y_w)$ is the residual, i.e. random and systematic un-modeled variation. The coefficients $a_{mns}$, $b_{mns}$, $c_{ms}$, and $MEEF_s$ are determined by minimizing the 2-norm of the residual $Res_{DI}(s, x_f, y_f, x_w, y_w)$ in equation (1). The linear least-squares problem is solved by standard techniques of matrix calculations (see Golub, G. H. and Van Loan, C. F., *Matrix Computations*, Sect. 2.5.3 and 2.5.6, 3rd ed. Baltimore, Md.: Johns Hopkins University Press, 1996). The least squares problem is solved separately for each test structure index, s.

Figure 6A:
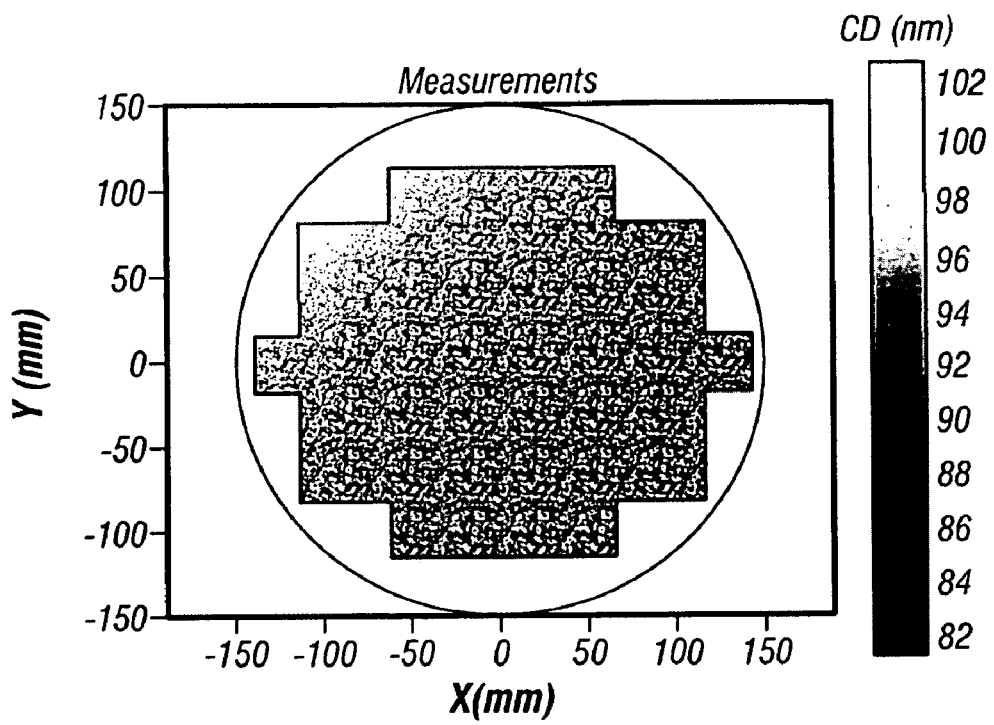
FIG. 6a shows a hypothetical critical dimension measurement made on a particular structure, at every zone, in every field of an embodiment.
Figure 6B:
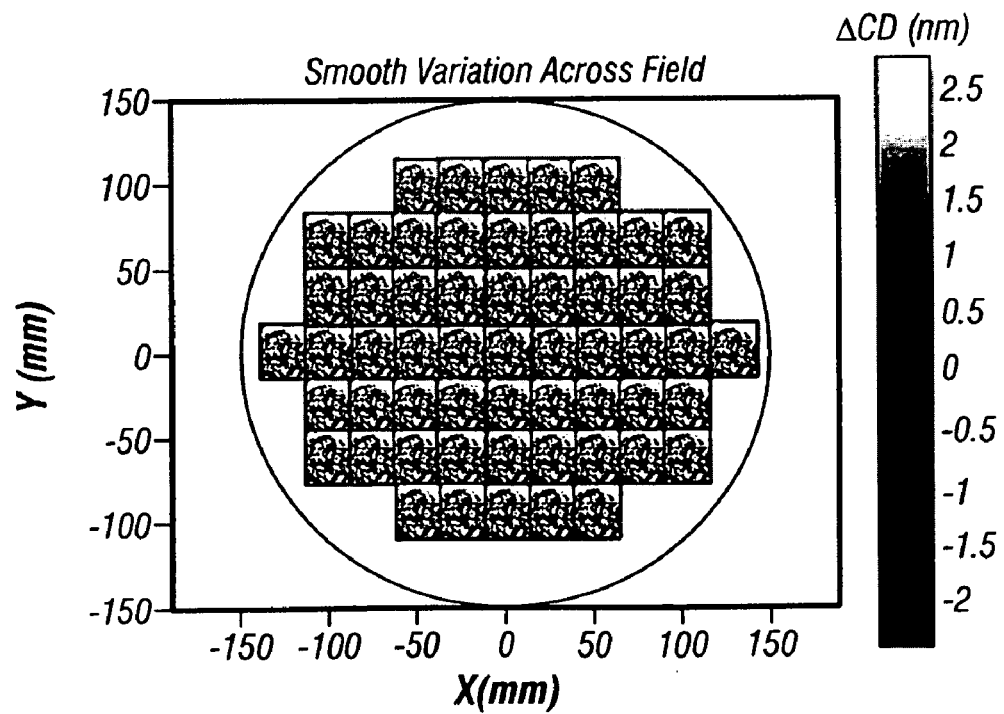
FIG. 6b shows the component of the measurement in FIG. 6a that varies smoothly with respect to field coordinates.
Figure 6C:
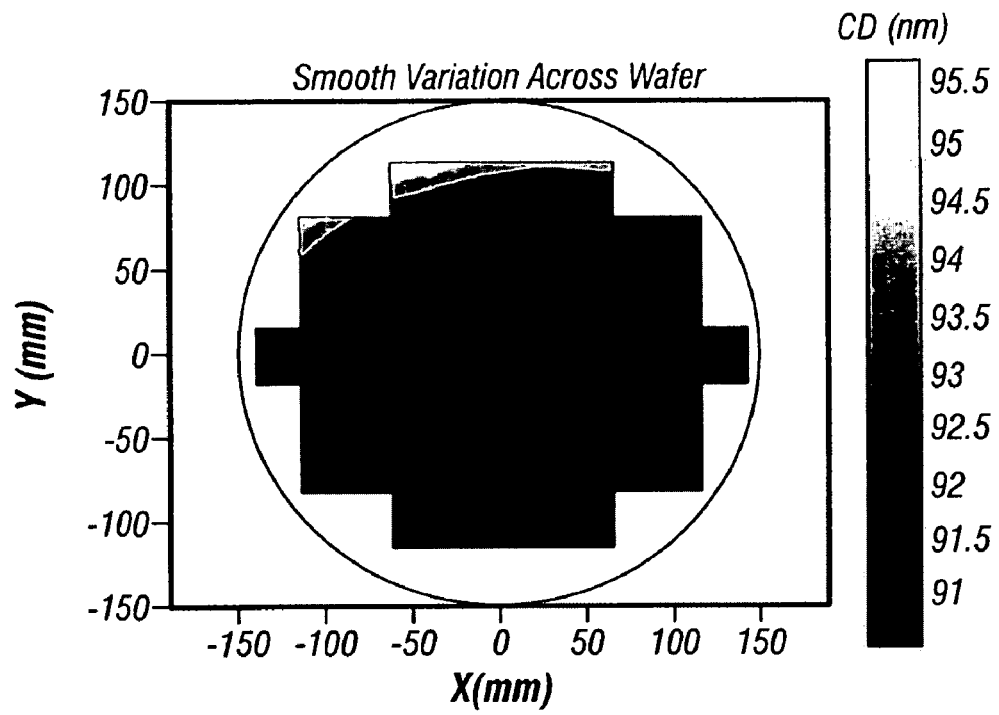
FIG. 6c shows the component of the measurement in FIG. 6a that varies smoothly with respect to wafer coordinates.
Figure 6D:
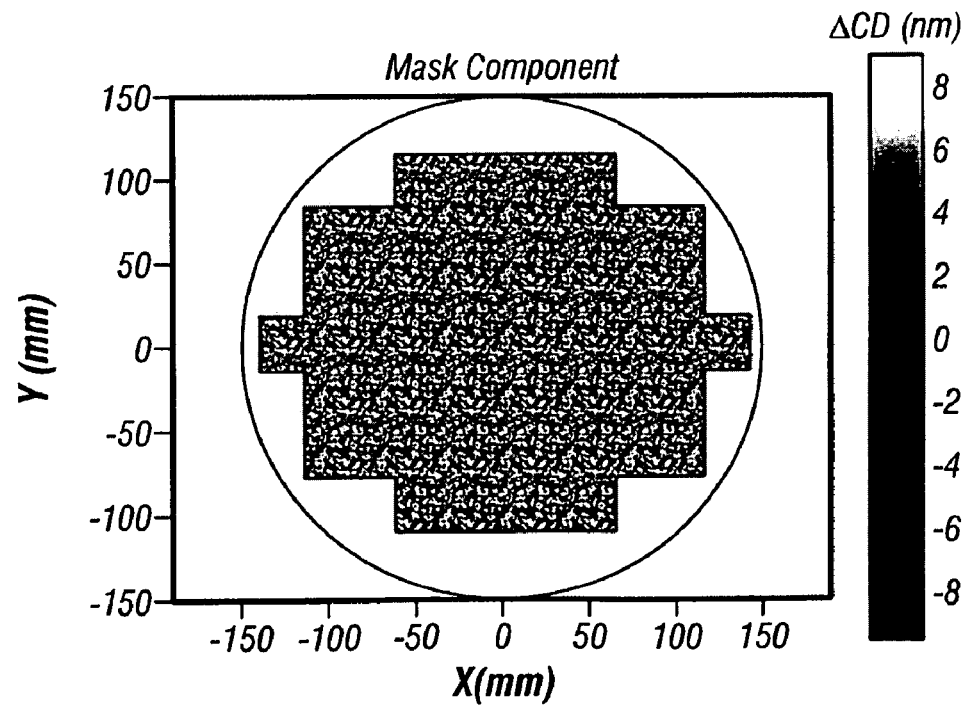
Figure 6E:
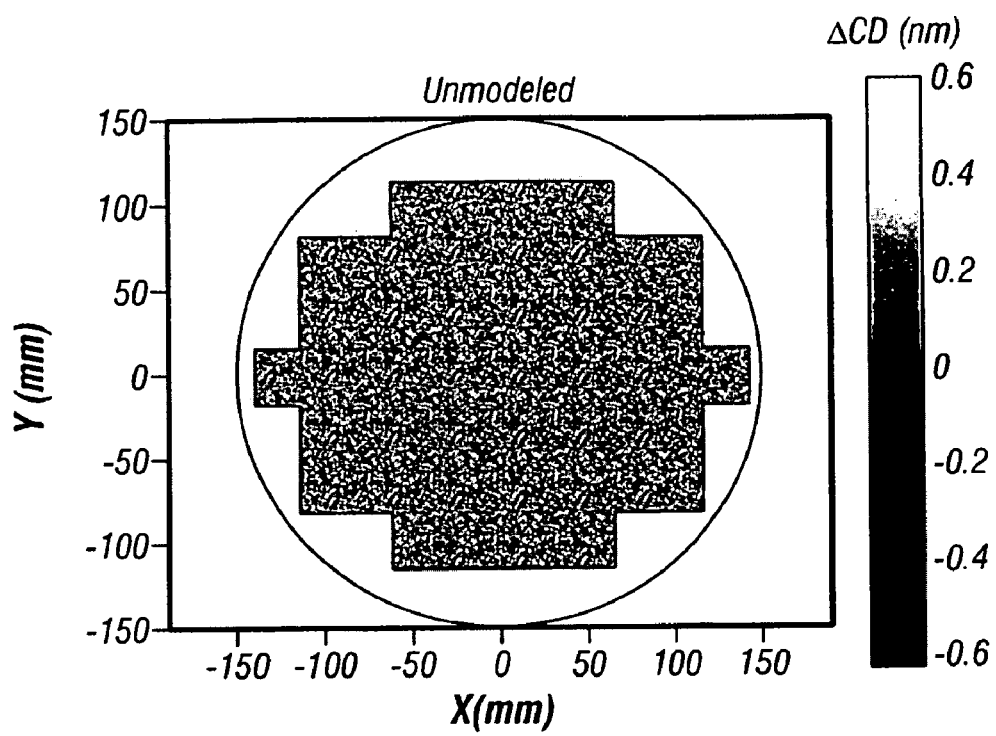
FIG. 6e shows the remainder of the measurement in FIG. 6a after the field wafer, and mask induced variability is taken out.

FIGS. 6a-e show a numerical example of the decomposition of measurements according to Equation (1). FIG. 6a shows a hypothetical CD measurement made on a particular structure s, at every zone, in every field. FIG. 6b shows the across-field variation, second term in (1). FIG. 6c shows the sum of the first and third terms in (1), which are the nominal value and the across-wafer variation. FIG. 6d shows the mask-induced variability, the fifth term in (1). FIG. 6e shows the remainder.

Figure 7A:
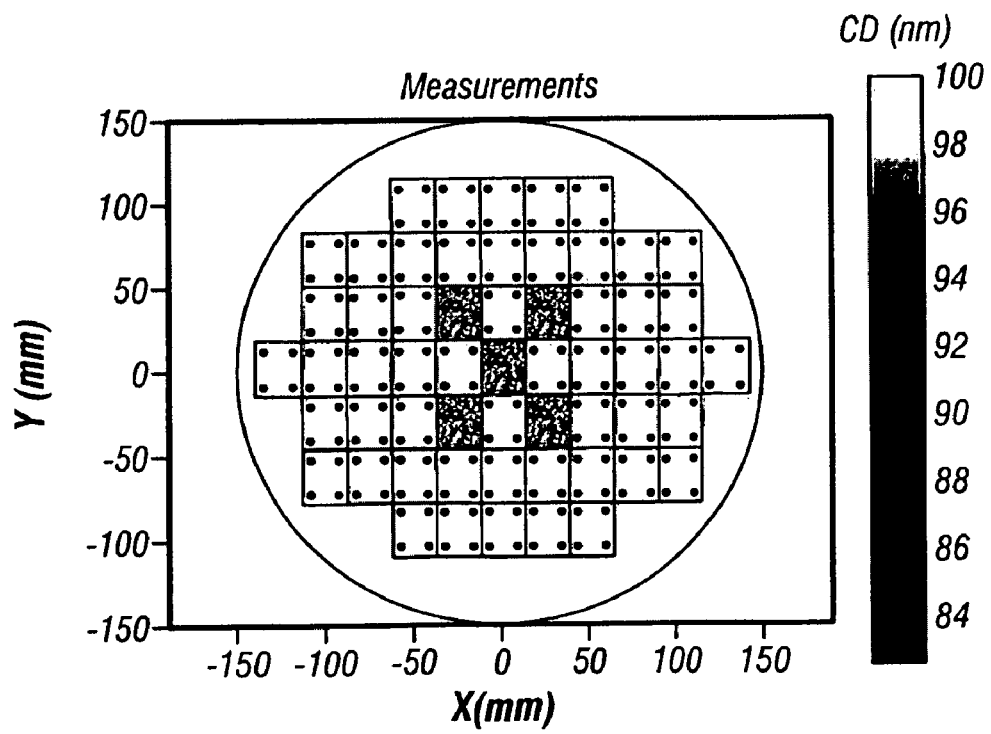
FIG. 7a shows a hypothetical critical dimension measurement of an embodiment made on a particular structure, according to a sparse sampling plan.
Figure 7B:
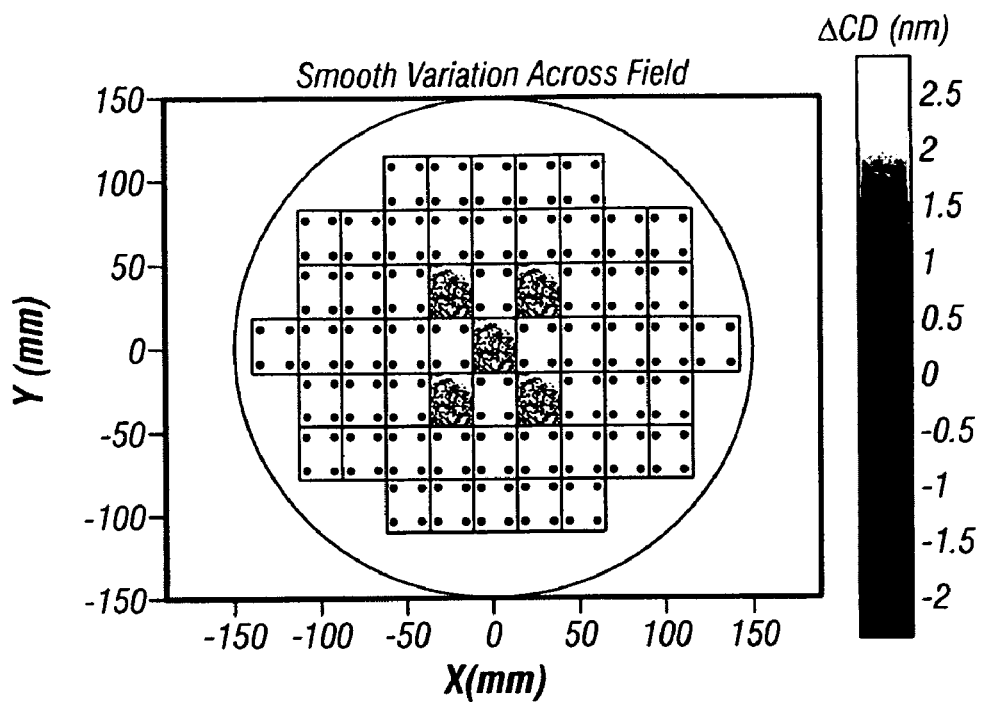
FIG. 7b shows the component of the measurement in FIG. 7a that varies smoothly with respect to field coordinates.
Figure 7C:
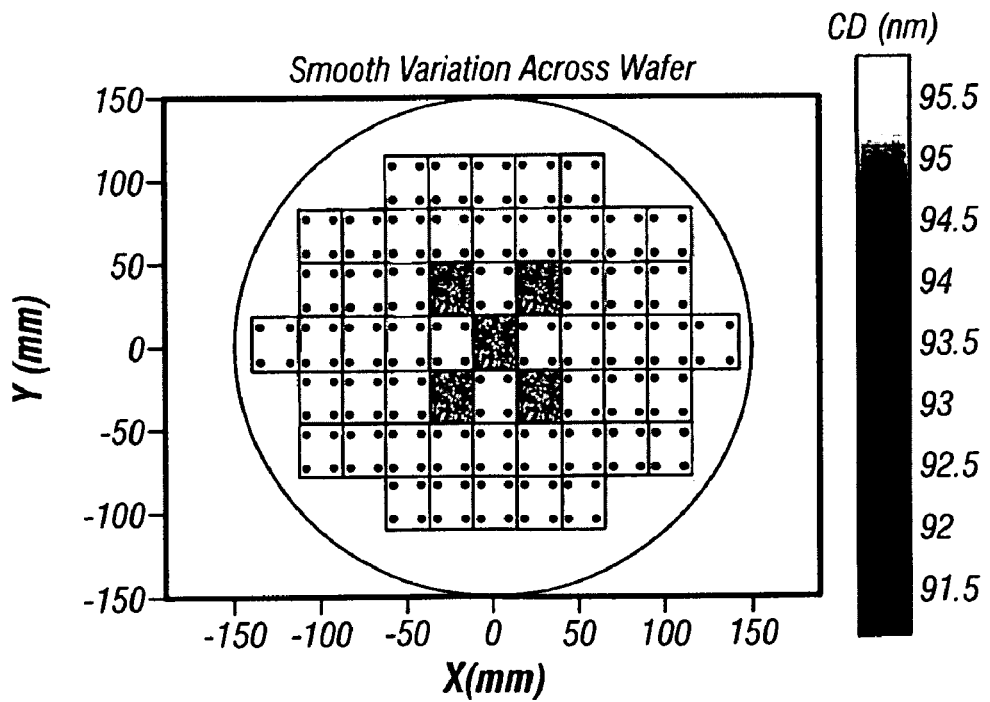
FIG. 7c shows the component of the measurement in FIG. 7a that varies smoothly with respect to wafer coordinates.
Figure 7D:
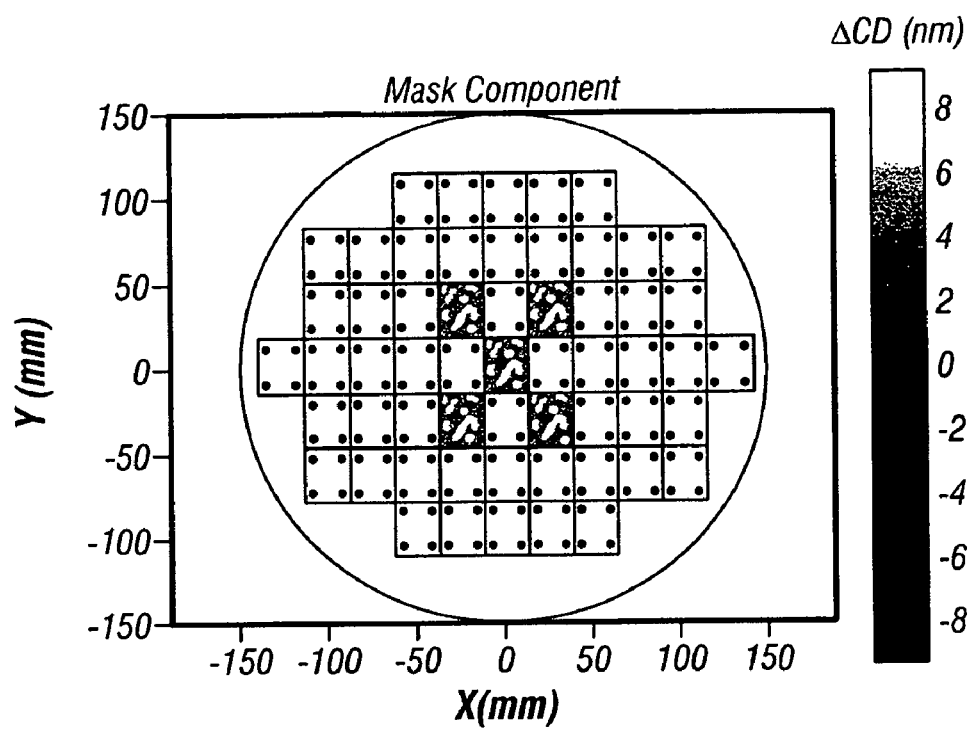
Figure 7E:
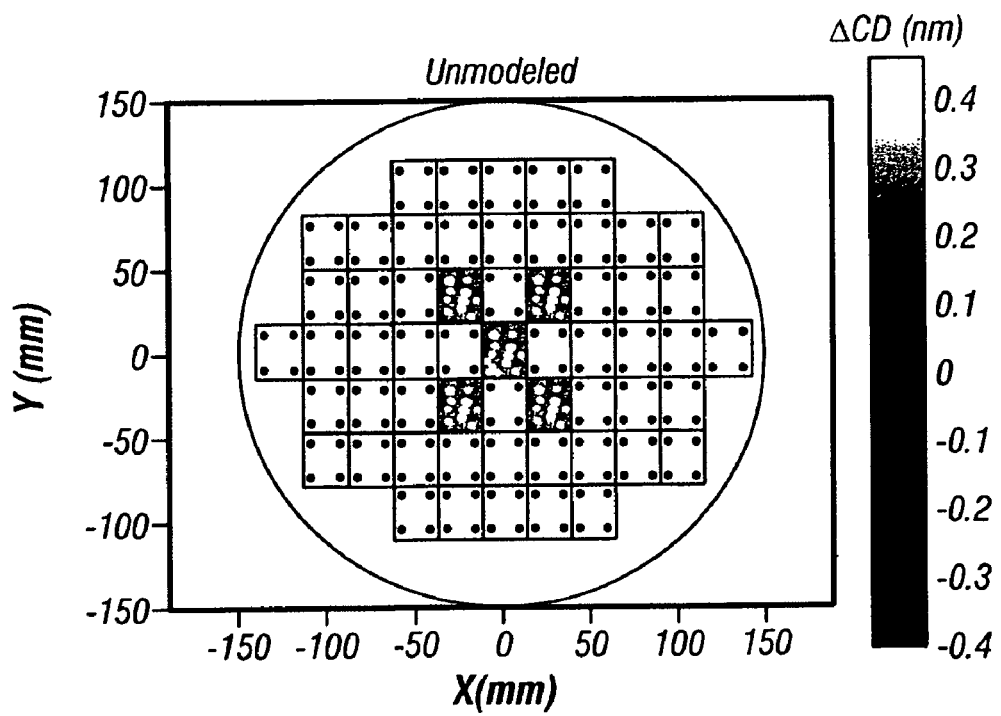
FIG. 7e shows the remainder of the measurement in FIG. 7a after the field, wafer, and mask induced variability is taken out.

The purpose of repeating the measurements at many fields across the wafer is to quantify and fingerprint the smooth variation across the wafer so that the across-wafer and across-field variations are not confused. Identifying the across-wafer variation, however, does not require sampling every zone at every field. The sparse sampling shown in FIG. 7a-e obtains the across-wafer variation by sampling 4 zones per field. (FIGS. 7a-e show the decomposition of sparsely-sampled measurements according to equation (1).) All zones 130 zones are measured in only 5 fields. FIG. 7a shows a hypothetical CD measurement made on a particular structure, according to the sparse sampling plan. FIG. 7b shows the across-field variation, second term in (1). FIG. 7c shows the sum of the first and third terms in (1), which are the nominal value and the across-wafer variation. FIG. 7d shows the mask-induced variability, the fifth term in (1). FIG. 7e shows the remainder.

Once the measurements are decomposed according to (1), across-wafer and random components (the residual) can be taken out of the measurements. This yields across-field variation of the lithography process:

$$\Delta CD_{AFLV,DI}(s, x_f, y_f) = \Sigma_{mn}\{A_{mn}(x_f, y_f)\alpha_{mns}\} \quad (2)$$

This would be the remaining the critical dimension variation if mask errors and across-wafer variations were eliminated. Similarly, the FI metrology (post wafer etch) can be decomposed as follows:

$$measurement_{WAFER,FI}(s, x_f, y_f, x_w, y_w) = \quad (3)$$

$$measurement_{WAFER,DI}(s, x_f, y_f, x_w, y_w) + \sum_{mn}\{A_{mn}(x_f, y_f)\alpha_{mns}\} +$$

$$\sum_{mn}\{B_{mn}(x_w, y_w)\beta_{mns}\} + Res_{FI}(s, x_f, y_f, x_w, y_w)$$

The second term on the right hand side of (3) represents variation of the etch bias across the imaging field. No such term is expected if all fields 103 have the same layout and they are uniformly spaced across the wafer. The zones are equally spaced across the wafer if the alleys between the fields, and the alleys between dies (fields) 103 within a field are of the same width. The third term on the right-hand side of (3) models across wafer variations in the etch process. The coefficients $\alpha_{mns}$ and $\beta_{mns}$ are determined by minimizing the 2-norm of the residual $Res_{FI}(s, x_f, y_f, x_w, y_w)$ in equation (3).

It should be noted that the across-wafer variation can be determined by any other process also including the process described in the other embodiments described in U.S. patent application Ser. No. 10/861,170.

In the present application the Inventors are presenting a specific application wherein the across-wafer variation thus obtained is used to determine best location on the wafer to develop the model.

Figure 8:
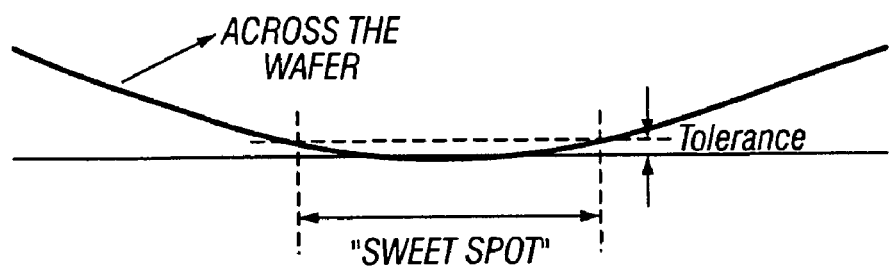
FIG. 8 illustrates a region on the wafer called the "Sweet Spot" where across wafer variation is less than pre-determined tolerance.

The Inventors have surprisingly noticed that the across-wafer variations usually have stationary region where the properties of patterning have zero or negligible gradient as sketched in FIG. 8. For example, if the across-wafer variation is radial, the center of the wafer is a stationary point. Usually the stationary point is not exactly at the center of the wafer. In the present application, the Inventors will call a region around the stationary point as "sweet-spot". The extent of the sweet spot is determined by a tolerance.

Figure 9:
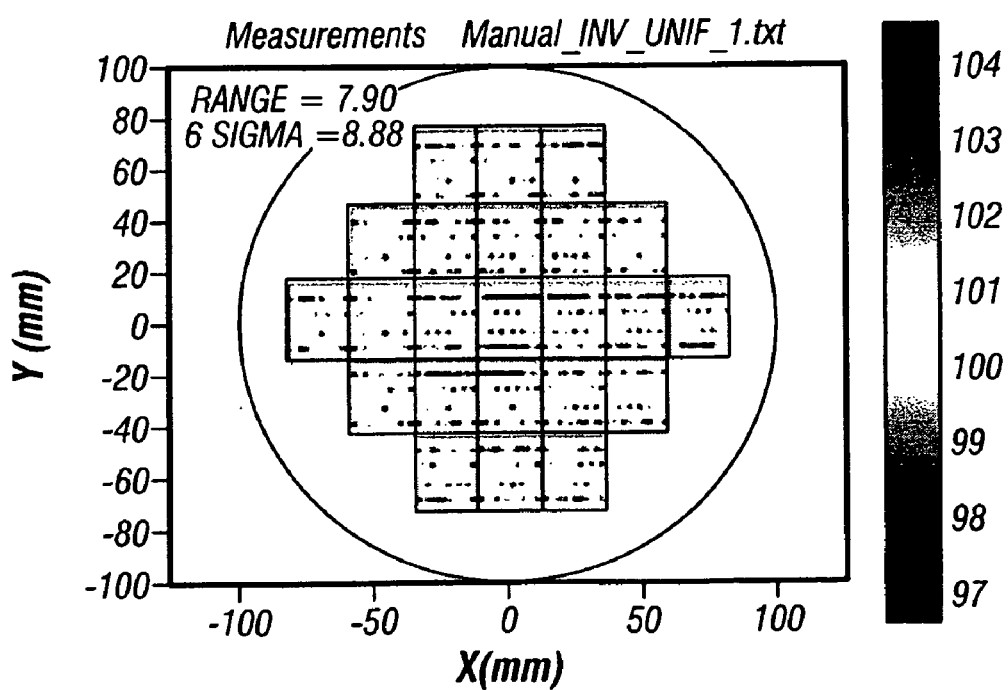
FIG. 9 shows the line width of a test target measured by CD-SEM at 35 locations in each of 23 exposure fields. The color axis shows line widths in nm.

The parameters measured i.e. the line width of the test target measure by CD-SEM at 35 locations in 23 exposure fields as shown in FIG. 9 were decomposed into the following components by solving a linear-least squares problem: a smooth variation across the wafer, a smooth variation that is replicated in each exposure field, a discontinuous remainder due to mask writing errors that is replicated in each exposure field, and a random, unmodeled remainder.

Figure 10A:
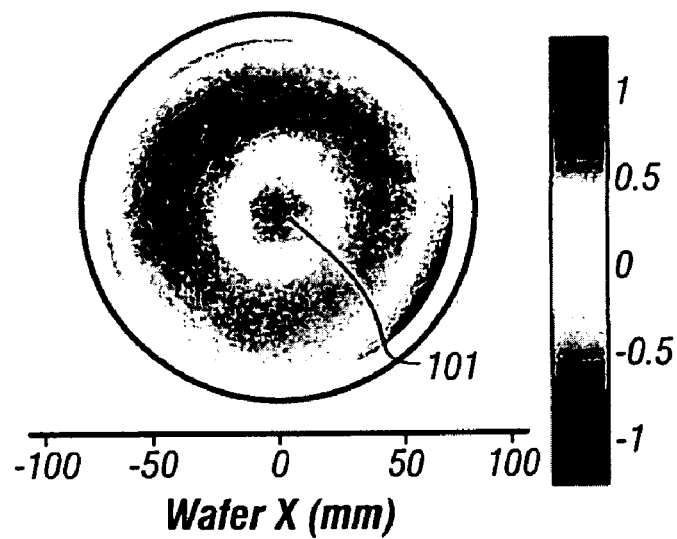
FIGS. 10a and 10b show across-wafer component of the linewidth variation over two wafers that were consecutively exposed. The color axis shows line width variation in nm.
Figure 10B:
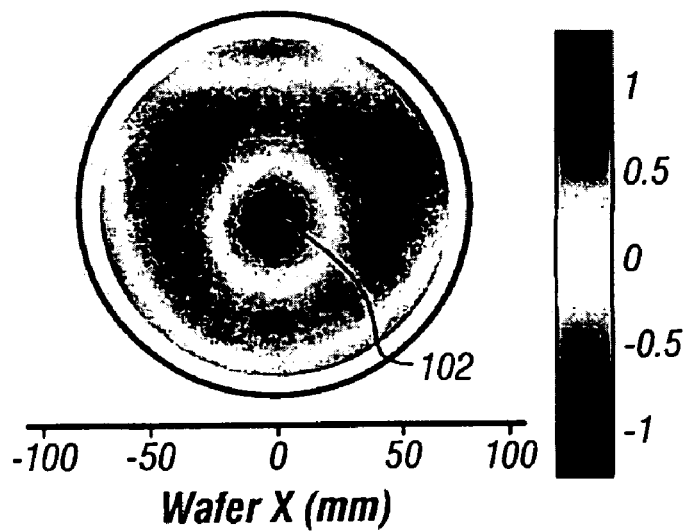

FIGS. 10a and 10b show the smooth variation in line width across two consecutively exposed wafers. The smooth variation is represented by a linear combination of the first 16 Zernike polynomials (this is not to be confused with wavefront error of a lens which is also commonly expressed as a linear combination of Zernike polynomials). Zernike polynomials are convenient to use since they are orthogonal in the unit disk (see: M. Born and E. Wolf, Principles of Optics, Sect. 9.2.1, Cambridge University Press, 7$^{th}$ Ed., 1999).

FIGS. 10a and 10b show sweet spots 101 and 102 in the two wafers, respectively. The location of the sweet spot was reproducible for the two wafers. The across-wafer variation shown in the said figure cannot be corrected by adjusting the mask data.

Figure 11A:
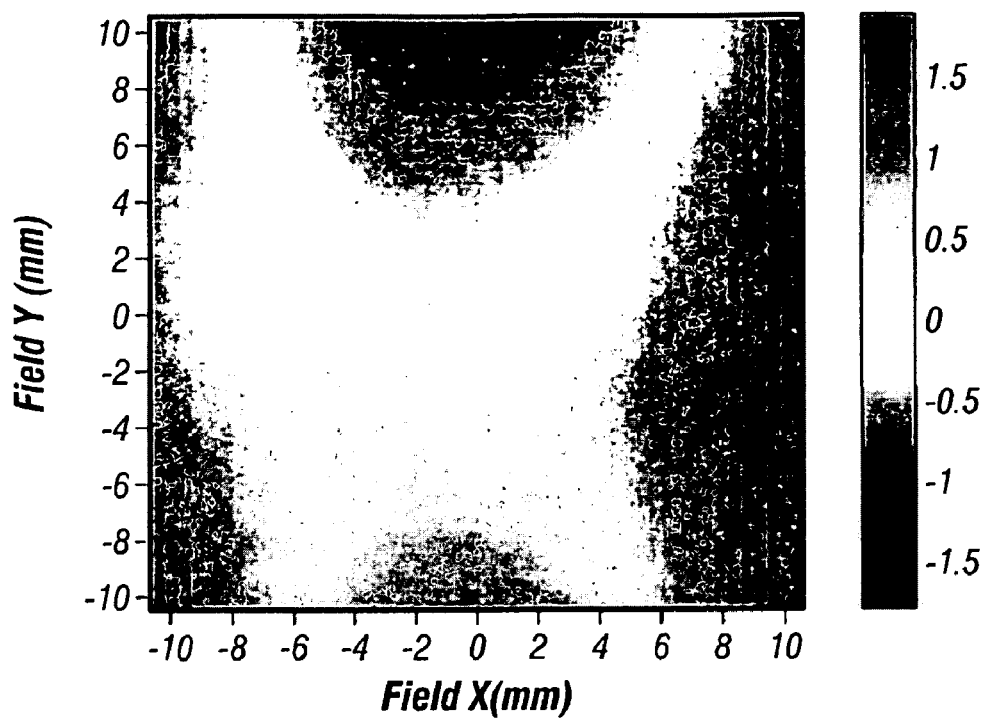
FIGS. 11a and 11b show across-field component of the linewidth variation over two wafers that were consecutively exposed. The color axis shows linewidth variation in nm.
Figure 11B:
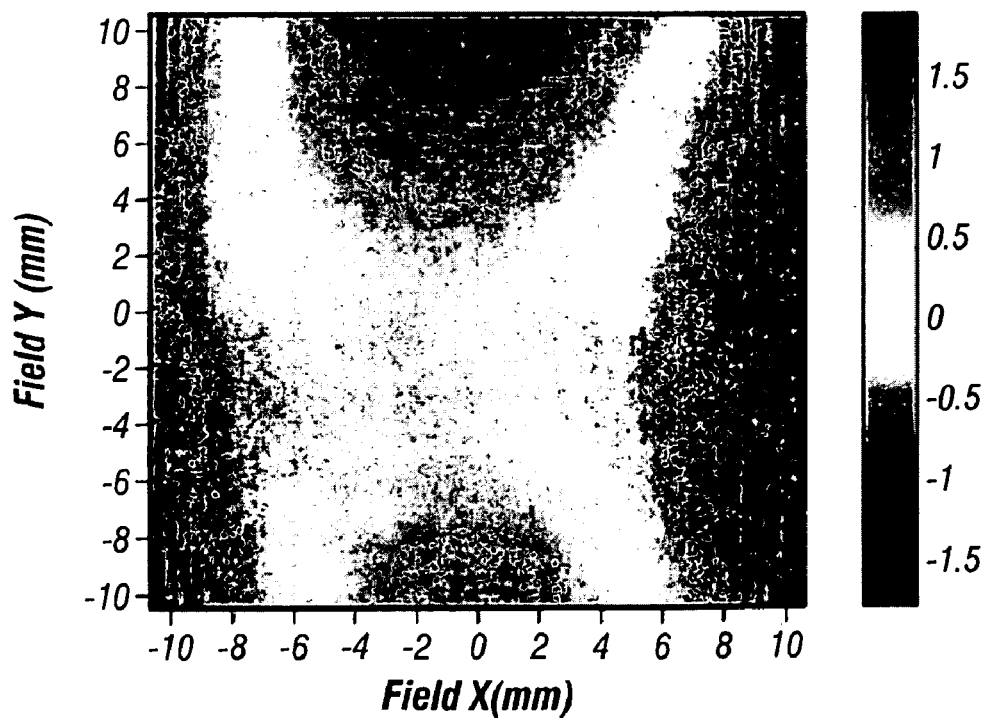

FIGS. 11a and 11b show a smoothly varying component of line width variation across the exposure field for two consecutively exposed wafers. This fingerprint, which is replicated at each exposure field, and which is evidently reproducible for the two wafers, is subject to correction by adjusting the mask data. A goal of the model calibration can be to capture and predict the finger print shown in FIGS. 11a and 11b.

Figure 12B:
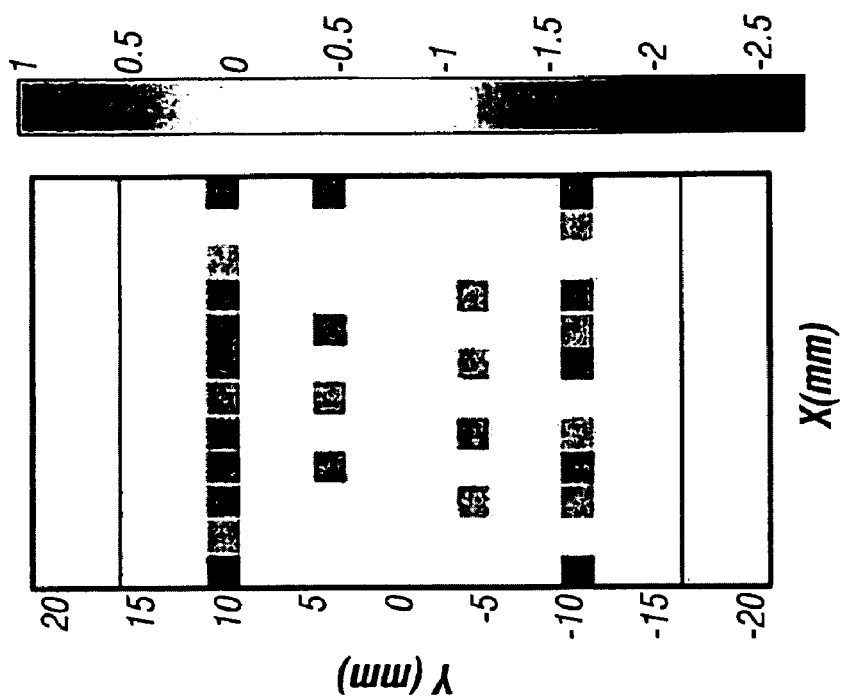
FIGS. 12a and 12b show Mask component of the linewidth variation over two wafers that were consecutively exposed. The color axis shows linewidth variation in nm.
Figure 12A:
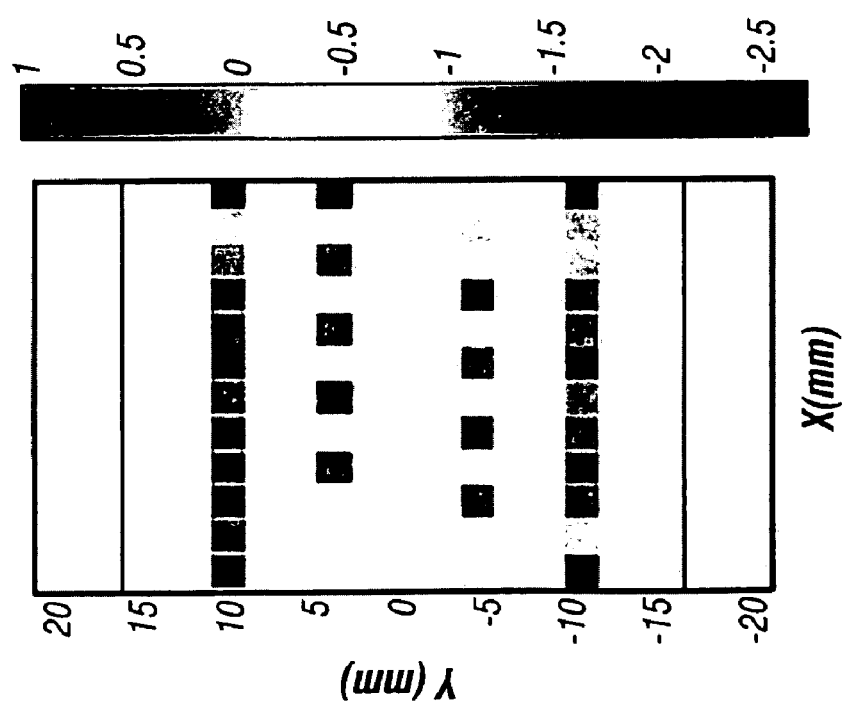

FIGS. 12a and 12b show a random remainder of line width variation that is replicated in each exposure field, and that is reproducible. The likely cause of this component is mask writing errors.

It is possible that there may be no sweet spot on the test wafer. For example, there may be a uniform gradient of line width across the wafer. The gradient may be so large that the patterning process may significantly vary across any set of calibration targets. In that case, the appropriate action is to service or correct the settings of the process equipment.

ALTERNATIVE EMBODIMENTS

The sweet spot can be located without decomposing the variation in a critical dimension into across-wafer and across field components. In an alternative embodiment, measurements are taken in the same field location, at many fields in the wafer. Alternatively, measurements at multiple sites in each field are averaged and the same average is calculated for many exposure fields on a wafer. A smooth function of wafer-position can be fitted to the measurements. The smooth function, for example can be a linear combinations of Zernike polynomials, or a linear combination of basis functions such as $r^n \cos m\phi$, $r^n \sin m\phi$; or $x^m y^n$. A smooth function can be fitted to the measurements by solving a linear equation such as $Ac=b$ in the least-squares sense, where A is a matrix whose entries are basis functions, c is a vector of coefficients of the linear combination, and b is a vector of measurements.

In accordance with an embodiment of the present invention, there is provided a method for generating an OPC computational model which takes into consideration across-wafer variations which occur during the process of manufacturing semiconductor chips based on the parameters of test patterns measured at the "wafer sweet spots" so as to arrive at an accurate model. The process of generating the OPC computational model comprises:

(a) printing test patterns at multiple sites of a wafer;

(b) measuring properties of the test patterns printed at multiple sites on the said wafer;

(c) selecting a location on the wafer, wherein the across-wafer variation is minimum; and (d) adjusting parameters of the computational model to minimize the difference between the predictions of the model and the measurements taken in the said selected spot.

In accordance with another embodiment of the present invention, the test pattern comprises a line, and wherein (b) comprises measuring a width of a line of the printed test pattern.

In yet another embodiment of the present invention, the test pattern comprises a space pattern and wherein (b) comprises measuring a width of the space pattern.

In still another embodiment of the present invention, the test pattern comprises a combination of line patterns and space patterns having predetermined width for the line pattern and predetermined width for the space pattern.

In a further embodiment of the present invention, the OPC correction model comprises a model of a mask manufacturing process.

In a further more embodiment of the present invention, the OPC correction model comprises a model of an optical exposure process.

In one more embodiment of the present invention, the OPC correction model comprises a model of resist processing.

In one another embodiment of the present invention, the OPC correction model comprises a model of an etch process.

In an embodiment of the present invention, the OPC correction model comprises of a combination or any subset of mask manufacturing process, optical exposure process, resist processing and etch process.

In another embodiment of the present invention, the OPC correction model is operative to predict a printed wafer image based on a given layout using a description of image transformation of at least one step of a patterning process.

In yet another embodiment of the present invention, the characteristics in (b) comprise a critical dimension of the test pattern printed on the wafer.

In still another embodiment, the present invention further comprising: extracting an across-wafer component of the variation in the properties measured, the component being a continuous function of position on the wafer.

In a further embodiment of the present invention, extracting an across-wafer component variation comprises fitting a smooth function of wafer-position to the critical dimension measurements.

In further more embodiment, the present invention further comprising:

(a) printing a test pattern on the selected location of a second wafer;

(b) measuring at least one property of the test patterns printed at the selected location of the said second wafer;

(c) adjusting a parameter of the computational model so that the difference between a prediction of the model and a measurement performed in the said selected location minimized.

In another embodiment, the present invention further comprising: making multiple sets of calibration measurements at multiple locations in the selected location; obtaining a set of model parameters from each set of calibration measurement; calculating the range of values of a model parameter takes among the multiple sets of model parameters, and verifying that the range is smaller than a tolerance.

In yet another embodiment of the present invention, the value of tolerance is user defined.

In accordance with another aspect of the present invention, there is provided a method for correcting lithographic data according to an across-wafer variation model of a patterning process, the method comprising:

(a) providing a computational model of a patterning process, wherein the model comprises corrected parameters obtained at locations on the wafer where across-wafer variation is minimum;

(b) using the computational model to make a prediction for how lithographic data transforms into a pattern on a wafer; and (c) applying corrections to the lithography data based on the prediction in (b).

It will be appreciated that embodiments of the invention described herein may be comprises of one or more conventional processors and unique stored program instructions that control the one or more processors to implement, in conjunction with certain non-processor circuits, some, most, or all of the functions of generating an OPC computational model described herein. As such these functions may be interpreted as steps of a method of generating an OPC computational model. Alternatively, some or all functions could be implemented by a state machine that has no stored program instructions or in one or more application specific integrated circuits (ASICs), in which each function or some combinations of certain of the functions are implemented as custom logic. Of course, a combination of the two approaches could be used. Thus, method and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

As described above, the subject matter of the present application is relevant to subject matter disclosed in co-pending patent application Ser. No. 10/861,170 filed Jun. 4, 2004, co-pending patent application Ser. No. 10/933,090 filed Sep. 1, 2004, Ser. No. 10/960,357 filed Oct. 6, 2004 and Ser. No. 10/971,350 filed Oct. 22, 2004, all of which are assigned to the Assignee of the present application. Any of the embodiments described in the above-listed documents can be used in combination with any of the embodiments described in the present application. The foregoing detailed description has described only a few of the many possible implementations of the present invention. Thus, the detailed description is given only by way of illustration and nothing contained in this section should be construed to limit the scope .of the invention. The claims are limited only by the following claims, including the equivalents thereof.

We claim:

1. A method of generating an OPC computational model comprises:
   a. printing test patterns at multiple sites of a wafer;
   b. measuring properties of the test patterns printed at multiple sites on the said wafer;
   c. extracting an across-wafer component of the measured properties, the component being a continuous function of position on the wafer;
   d. selecting a location on the wafer, wherein a gradient of the across-wafer component is minimum; and
   e. adjusting parameters of the computational model to minimize the difference between the predictions of the model and the measurements taken in the said selected spot.

2. The method of claim 1, wherein the test pattern comprises a line, and wherein (b) comprises measuring a width of a line of the printed test pattern.

3. The method of claim 1, wherein the test pattern comprises a space pattern and wherein (b) comprises measuring a width of the space pattern.

4. The method of claim 1, wherein the test pattern comprises a combination of line and space patterns having predetermined width for the line pattern and space pattern.

5. The method of claim 1, wherein the OPC correction model comprises a model of a mask manufacturing process.

6. The method of claim 1, wherein the OPC correction model comprises a model of an optical exposure process.

7. The method of claim 1, wherein the OPC correction model comprises a model of resist processing.

8. The method of claim 1, wherein the OPC correction model comprises a model of an etch process.

9. The method of claim 1, wherein the OPC correction model comprises of a combination or any subset of mask manufacturing process, optical exposure process, resist processing and etch process.

10. The method of claim 1, wherein the OPC correction model is operative to predict a printed wafer image based on a given layout using a description of image transformation of at least one step of a patterning process.

11. The method of claim 1, wherein the properties in (b) comprise a critical dimension of the test pattern printed on the wafer.

12. The method of claim 1, further comprising: extracting an across-wafer component of the variation in the properties measured, the component being a continuous function of position on the wafer.

13. The method of claim 12, wherein extracting an across-wafer component variation comprises fitting a smooth function of wafer-position to the critical dimension measurements.

14. The method of claim 1, further comprising:
   a. printing a test pattern on the selected location of a second wafer;
   b. measuring at least one property of the test patterns printed at the selected location of the said second wafer; and
   c. adjusting a parameter of the computational model so that the difference between a prediction of the model and a measurement performed in the said selected location minimized.

15. The method of claim 1, further comprising:
   making multiple sets of calibration measurements at multiple locations in the selected location;
   obtaining a set of model parameters from each set of calibration measurement;
   calculating the range of values of a model parameter takes among the multiple sets of model parameters, and verifying that the range is smaller than a tolerance.

16. The method of claim 15, wherein the value of tolerance is user defined.

17. A method of generating an OPC computational model comprises:
   a. printing test patterns at multiple sites of a wafer;
   b. measuring properties of the test patterns printed at multiple sites on the said wafer;
   c. extracting an across-wafer component of the measured properties, the component being a continuous function of position on the wafer;
   d. separating the variations in the measurement made in step (b) into an across-wafer variation and other components of variation;
   e. selecting a location on the wafer, wherein a gradient of an across-wafer component is minimum;
   f. printing at least one test targets on the said location;
   g. measuring properties of the said test targets selected in the said location, and
   h. adjusting parameters of the computational model to minimize the difference between the predictions of the model and the measurements taken in the said selected spot.

18. The method of claim 17, wherein the test pattern comprises a line, and wherein (b) comprises measuring a width of a line of the printed test pattern.

19. The method of claim 17, wherein the test pattern comprises a space pattern and wherein (b) comprises measuring a width of the space pattern.

20. The method of claim 17, wherein the test pattern comprises a combination of line patterns and space patterns having predetermined width for the line pattern and predetermined width for the space pattern.

21. The method of claim 17, wherein the properties in (b) comprise a critical dimension of the test pattern printed on the wafer.

22. A method of calibrating a computational model of a patterning process, said method comprising:
   a. printing test patterns at multiple sites of a wafer;
   b. measuring a critical dimension of the test patterns printed at multiple sites on the said wafer;
   c. extracting an across-wafer component of the variation in the critical dimension measurements, the component being a continuous function of position on the wafer;
   d. selecting a sweet-spot on the wafer where the gradient of the across-wafer component is small;
   e. adjusting a parameter of the computational model so that the difference between a prediction of the model and a measurement performed in the sweet spot is minimized.

23. The method of claim 22, wherein the test pattern comprises a line, and wherein (b) comprises measuring a width of a line of the printed test pattern.

24. The method of claim 22, wherein the test pattern comprises a space pattern and wherein (b) comprises measuring a width of the space pattern.

25. The method of claim 22, wherein the test pattern comprises a combination of line patterns and space patterns having predetermined width for the line pattern and predetermined width for the space pattern.

* * * * *